United States Patent
Goyal et al.

(10) Patent No.: US 11,221,513 B2
(45) Date of Patent: Jan. 11, 2022

(54) ELECTRONIC DEVICE DISPLAY WITH A BACKLIGHT

(71) Applicant: Apple Inc., Cupertino, CA (US)

(72) Inventors: Supriya Goyal, San Jose, CA (US);
Yuxi Zhao, San Jose, CA (US);
Xinsheng Chu, Saratoga, CA (US);
Chan Hyuk Park, Cupertino, CA (US);
Min Tao, San Jose, CA (US); Wenyong Zhu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/439,449

(22) Filed: Jun. 12, 2019

(65) Prior Publication Data
US 2020/0133046 A1   Apr. 30, 2020

Related U.S. Application Data

(60) Provisional application No. 62/751,438, filed on Oct. 26, 2018.

(51) Int. Cl.
*G02F 1/13* (2006.01)
*G02F 1/13357* (2006.01)
(Continued)

(52) U.S. Cl.
CPC ....... *G02F 1/133603* (2013.01); *G02B 6/005* (2013.01); *G02B 6/0038* (2013.01);
(Continued)

(58) Field of Classification Search
CPC ... H05K 1/02; H05K 1/11; H05K 1/14; H05K 1/141–144; H05K 1/18; H05K 1/181–188; G02B 6/0061–0068
(Continued)

(56) References Cited

U.S. PATENT DOCUMENTS 5,317,438 A * 5/1994 Suzuki ................ G02F 1/13452
349/149
5,854,872 A   12/1998 Tai
(Continued)

FOREIGN PATENT DOCUMENTS

CN   101308264 A   11/2008
CN   101435951 A   5/2009
(Continued)

*Primary Examiner* — Tuan T Dinh
(74) *Attorney, Agent, or Firm* — Treyz Law Group, P.C.; Joseph F. Guihan

(57) ABSTRACT

An electronic device includes display layers such as liquid crystal display layers and a backlight unit that provides illumination for the display layers. The backlight unit includes light-emitting diodes that emit light into the edge of a light guide film. To minimize the inactive area of the display, the light-emitting diodes are tightly spaced to approximate a line light source instead of point light sources. Color and/or luminance compensation layers are incorporated at various locations within the backlight structures to ensure that the backlight provided to the display layers is homogenous. A thin-film transistor layer of the display is coupled to a printed circuit board by a flexible printed circuit. The flexible printed circuit has additional solder mask layers to improve robustness, encapsulation, and traces with a varying pitch.

3 Claims, 40 Drawing Sheets

(51) Int. Cl.
*F21V 8/00* (2006.01)
*H05K 1/11* (2006.01)
*G02F 1/1345* (2006.01)
*H05K 1/02* (2006.01)
*H01R 12/62* (2011.01)
*H01R 4/04* (2006.01)
*G02F 1/1368* (2006.01)
*G02F 1/133* (2006.01)
*G09G 3/00* (2006.01)
*G09G 3/36* (2006.01)

(52) U.S. Cl.
CPC ......... *G02B 6/0051* (2013.01); *G02B 6/0053* (2013.01); *G02B 6/0068* (2013.01); *G02B 6/0073* (2013.01); *G02B 6/0083* (2013.01); *G02B 6/0088* (2013.01); *H05K 1/118* (2013.01); *G02B 6/0061* (2013.01); *G02F 1/1368* (2013.01); *G02F 1/13306* (2013.01); *G02F 1/13452* (2013.01); *G09G 3/006* (2013.01); *G09G 3/3648* (2013.01); *H01R 4/04* (2013.01); *H01R 12/62* (2013.01); *H05K 1/0281* (2013.01); *H05K 2201/094* (2013.01); *H05K 2201/10106* (2013.01); *H05K 2201/10136* (2013.01); *H05K 2201/10674* (2013.01)

(58) Field of Classification Search
USPC .................. 361/749–750, 782–784, 803; 349/149–153; 174/250, 350, 520
See application file for complete search history.

(56) References Cited

U.S. PATENT DOCUMENTS

| | | | |
|---|---|---|---|
| 5,886,759 A | 3/1999 | Mashino et al. | |
| 5,959,709 A * | 9/1999 | Asada | H05K 1/147 349/150 |
| 6,086,441 A * | 7/2000 | Akiguchi | H01J 9/28 349/152 |
| 6,664,942 B1 * | 12/2003 | Kim | G02F 1/13452 345/204 |
| 7,746,662 B2 * | 6/2010 | Nakanishi | G06F 3/045 361/782 |
| 7,876,489 B2 | 1/2011 | Gandhi et al. | |
| 7,957,082 B2 | 1/2011 | Gandhi et al. | |
| 8,384,121 B2 * | 2/2013 | Tischler | F21V 3/02 257/99 |
| 9,348,079 B2 | 5/2016 | Lee et al. | |
| 9,690,038 B2 | 6/2017 | Boyd et al. | |
| 9,851,489 B2 | 12/2017 | Bang et al. | |
| 10,215,905 B2 | 2/2019 | Nichol et al. | |
| 10,222,537 B2 | 3/2019 | Park et al. | |
| 10,268,077 B2 | 4/2019 | Banin et al. | |
| 2002/0024302 A1 * | 2/2002 | Wu | H01J 11/48 313/582 |
| 2005/0225561 A1 | 10/2005 | Higgins et al. | |
| 2006/0268530 A1 * | 11/2006 | Nagao | H05K 1/028 361/749 |
| 2009/0086508 A1 | 4/2009 | Bierhuizen | |
| 2011/0116275 A1 | 5/2011 | Sheek | |
| 2011/0141769 A1 | 6/2011 | Lee et al. | |
| 2011/0255023 A1 | 10/2011 | Doyle et al. | |
| 2013/0155025 A1 | 6/2013 | Lai et al. | |
| 2013/0293810 A1 | 11/2013 | Ke et al. | |
| 2014/0098143 A1 | 4/2014 | Lee et al. | |
| 2015/0117052 A1 | 4/2015 | Hsu | |
| 2015/0279281 A1 | 10/2015 | Nakahata et al. | |
| 2016/0033715 A1 | 2/2016 | Lee et al. | |
| 2016/0103267 A1 | 4/2016 | An et al. | |
| 2016/0306090 A1 | 10/2016 | Pu et al. | |
| 2016/0320545 A1 | 11/2016 | Hirayama et al. | |
| 2016/0161661 A1 | 12/2016 | Cho et al. | |
| 2017/0052301 A1 | 2/2017 | Liu et al. | |
| 2017/0329180 A1 | 11/2017 | Hirayama et al. | |
| 2018/0275334 A1 | 9/2018 | Tsuji | |
| 2020/0110213 A1 | 4/2020 | Shiba | |

FOREIGN PATENT DOCUMENTS

| | | |
|---|---|---|
| CN | 201928516 U | 8/2011 |
| CN | 102650706 A | 8/2012 |
| CN | 103629598 A | 3/2014 |
| CN | 104848052 A | 8/2015 |
| CN | 104950507 A | 9/2015 |
| CN | 205507309 U | 8/2016 |

* cited by examiner

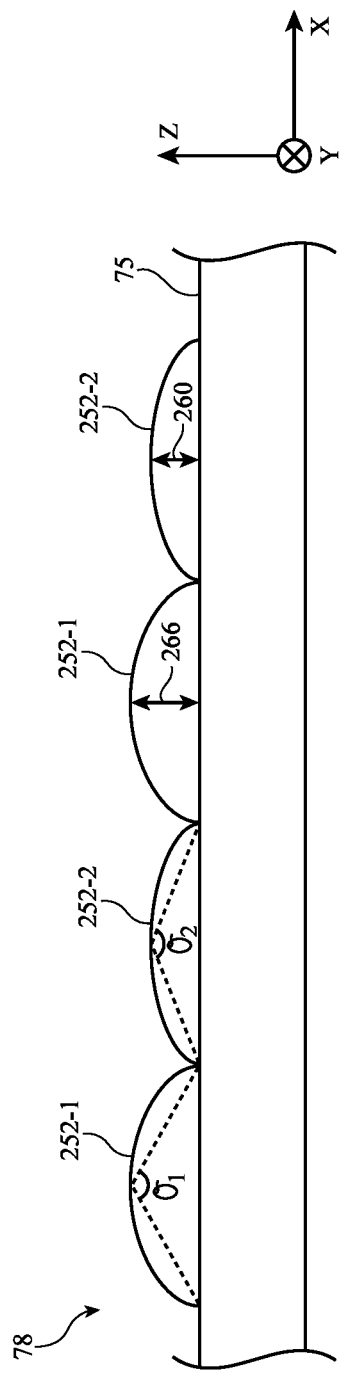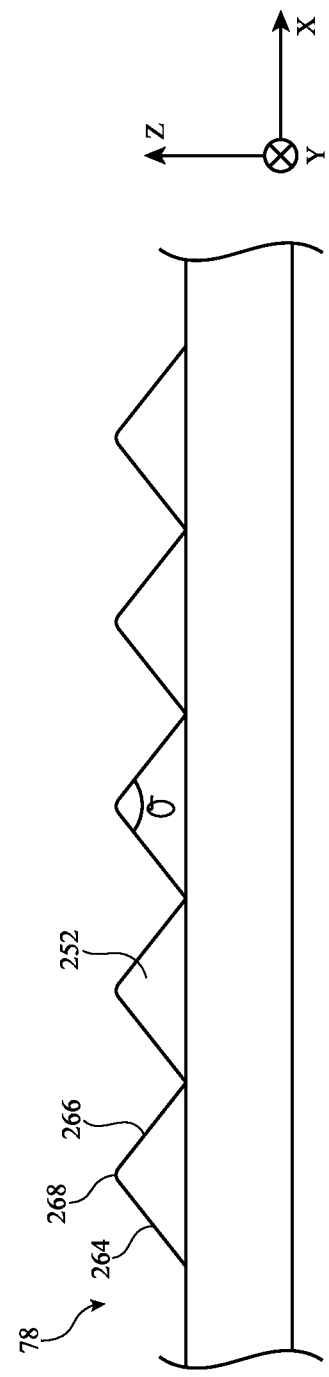

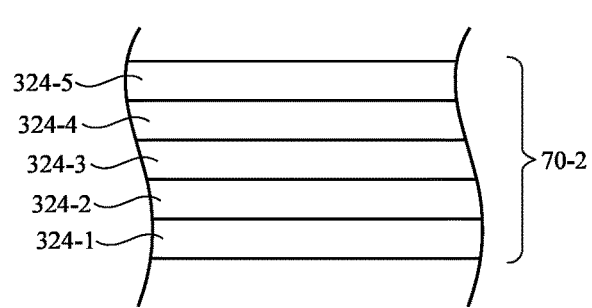 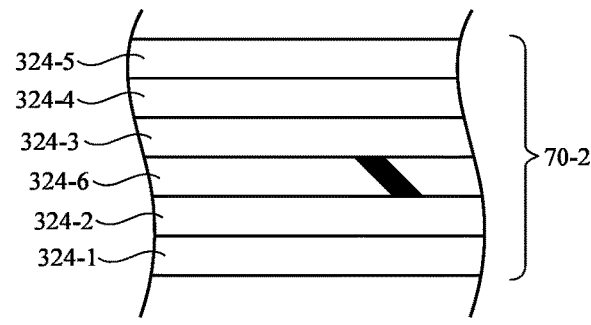
*FIG. 28*     *FIG. 29*

| COLOR | RED | GREEN | BLUE |
|---|---|---|---|
| GRAY LEVEL | 255 | 255 | 255 |
| WHITE-TO-BLACK TRANSITION TIME (ms) | 10.0 | 10.0 | 10.0 |

*FIG. 43A*

| COLOR | RED | GREEN | BLUE |
|---|---|---|---|
| GRAY LEVEL | 241 | 254 | 234 |
| WHITE-TO-BLACK TRANSITION TIME (ms) | 9.5 | 10.0 | 9.4 |

*FIG. 43B*

ELECTRONIC DEVICE DISPLAY WITH A BACKLIGHT

This application claims the benefit of provisional patent application No. 62/751,438, filed Oct. 26, 2018, which is hereby incorporated by reference herein in its entirety.

BACKGROUND

This relates generally to electronic devices with displays, and, more particularly, to displays with backlights.

Electronic devices such as computers, cellular telephones, and tablets have displays. Some displays such as organic light-emitting diode displays have arrays of pixels that generate light. In displays of this type, backlighting is not necessary because the pixels themselves produce light. Other displays contain passive pixels that can alter the amount of light that is transmitted through the display to display information for a user. Passive pixels do not produce light themselves, so it is often desirable to provide backlight for a display with passive pixels. Passive pixels may be formed from a layer of liquid crystal material formed between two electrode layers and two polarizer layers.

In a typical backlight assembly for a display, a light guide plate is used to distribute backlight generated by a light source such as a light-emitting diode light source. A reflector may be formed under the light guide plate to improve backlight efficiency.

Conventional backlight assemblies may cause visible artifacts, may not be robust, and may occupy an undesirably large amount of space within an electronic device.

It would therefore be desirable to be able to provide displays with improved backlights.

SUMMARY

A display may have an array of pixels for displaying images for a viewer. The array of pixels may be formed from display layers such as a color filter layer, a liquid crystal layer, a thin-film transistor layer, an upper polarizer layer, and a lower polarizer layer.

A backlight unit may be used to produce backlight illumination for the display. The backlight illumination may pass through the polarizers, the thin-film transistor layer, the liquid crystal layer, and the color filter layer. The backlight unit may have a row of light-emitting diodes that are mounted on a flexible printed circuit board and that emit light into a light guide layer.

To minimize the size of the inactive area of the display, the light-emitting diodes that provide the backlight to the light guide layer may be positioned close together along the flexible printed circuit board. The light-emitting diodes may be flip chip bonded to the flexible printed circuit board and may approximate a line light source instead of separate point light sources.

Color and/or luminance compensation layers may be incorporated at various locations within the backlight structures to ensure that the backlight provided to the display layers is homogenous. For example, colored tape may be included on light guide layer tabs or a colored adhesive layer may be used to attach the light guide layer to a chassis.

The thin-film transistor layer of the display may be coupled to a printed circuit board by a flexible printed circuit. The display driver integrated circuit for the thin-film transistor layer may be mounted on the flexible printed circuit. The flexible printed circuit may have additional solder mask layers to improve the robustness of the flexible printed circuit. The flexible printed circuit may also include encapsulation. The flexible printed circuit may have traces with a pitch that varies across the length of the flexible printed circuit. A stainless steel stiffener may be included on the flexible printed circuit opposite the display driver integrated circuit.

BRIEF DESCRIPTION OF THE DRAWINGS

FIG. 13 is a cross-sectional side view of illustrative light-scattering features having alternating cross-sectional shapes with different heights in accordance with an embodiment.

FIG. 14 is a cross-sectional side view of illustrative light-scattering features having a cross-sectional shape of a triangle with a rounded tip in accordance with an embodiment.

FIG. 28 is a cross-sectional side view of the illustrative additional optical film between the turning film and the display layers in accordance with an embodiment.

FIG. 29 is a cross-sectional side view of the illustrative additional optical film between the turning film and the display layers with a diffusive pressure sensitive adhesive layer in accordance with an embodiment.

FIGS. 43A and 43B shows illustrative tables of RGB values associated with different white points in accordance with an embodiment.

DETAILED DESCRIPTION

Figure 1:
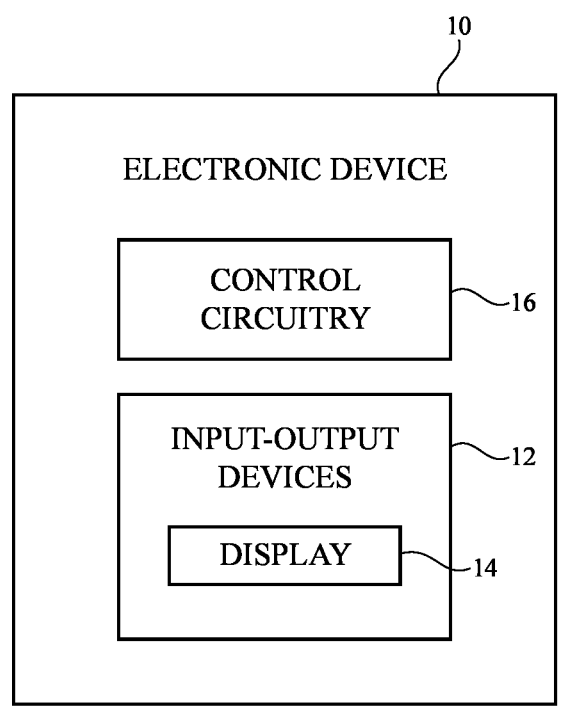
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Device 10 may be a tablet computer, laptop computer, a desktop computer, a television, a cellular telephone, a media player, a wristwatch device or other wearable electronic equipment, or other suitable electronic device.

Display 14 for device 10 includes an array of pixels. The array of pixels may be formed from liquid crystal display (LCD) components or other suitable display structures. Configurations based on liquid crystal display structures are sometimes described herein as an example.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass sheet, a clear plastic layer, or other transparent member.

Figure 2:
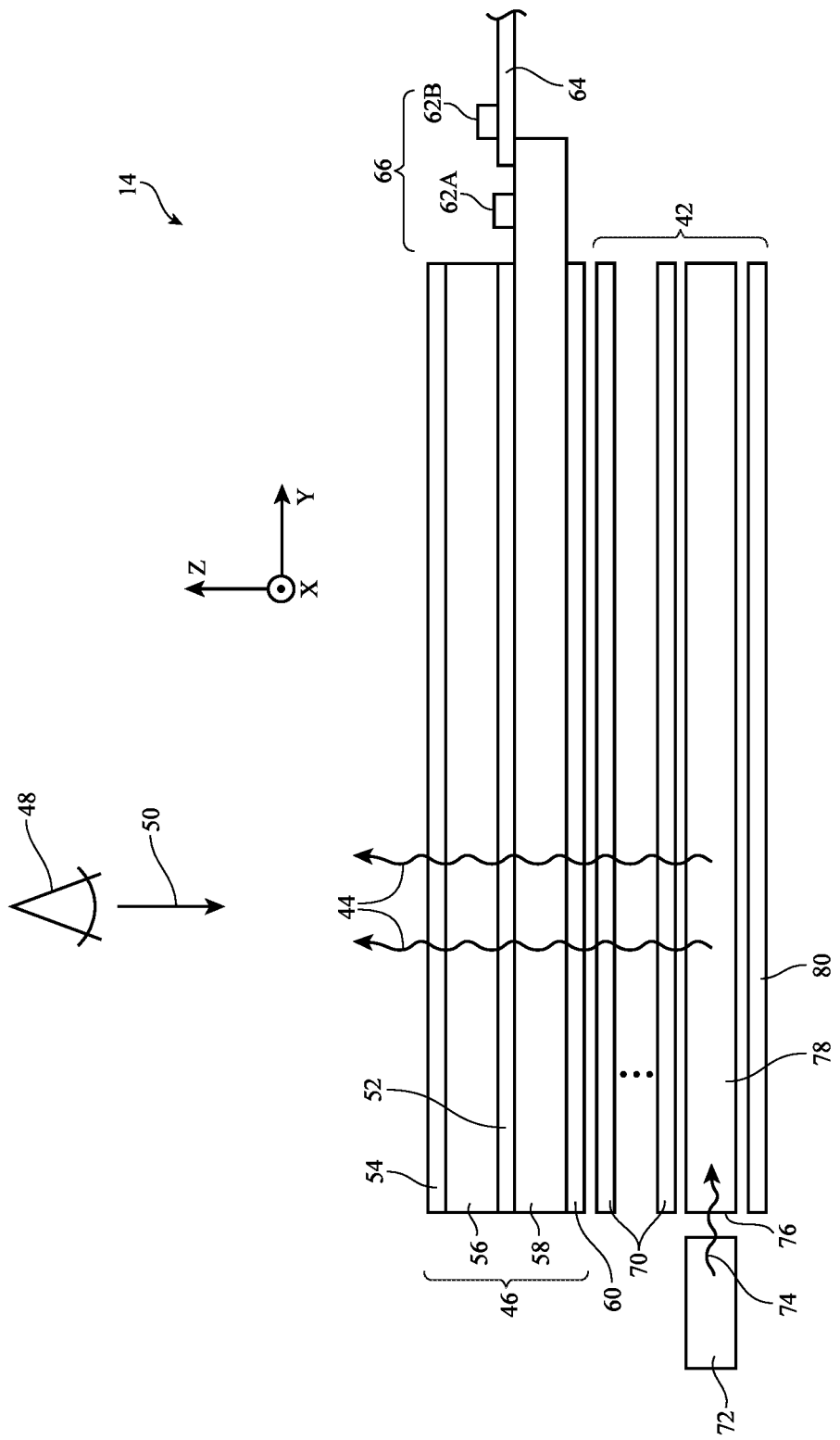
FIG. 2 is a cross-sectional side view of an illustrative display in an electronic device in accordance with an embodiment.

A cross-sectional side view of an illustrative configuration for display 14 of device 10 is shown in FIG. 2. As shown in FIG. 2, display 14 may include a backlight unit such as backlight unit 42 (sometimes referred to as a backlight or backlight structures) for producing backlight 44. During operation, backlight 44 travels outwards (vertically upwards in dimension Z in the orientation of FIG. 2) and passes through pixel structures in display layers 46. This illuminates any images that are being produced by the pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in a housing in device 10 or display layers 46 may be mounted directly in an electronic device housing for device 10 (e.g., by stacking display layers 46 into a recessed portion in a metal or plastic housing). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of pixel circuits based on thin-film transistors and associated electrodes (pixel electrodes) for applying electric fields to liquid crystal layer 52 and thereby displaying images on display 14. Layer 56 may be a color filter layer that includes an array of color filter elements for providing display 14 with the ability to display color images. If desired, layer 58 may be a color filter layer and layer 56 may be a thin-film transistor layer. Configurations in which color filter elements are combined with thin-film transistor structures on a common substrate layer may also be used.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example). Integrated circuits such as integrated circuit 62A and/or flexible printed circuits such as flexible printed circuit 64 may be attached to substrate 58 in ledge region 66 (as an example).

Backlight structures 42 may include a light guide layer such as light guide layer 78. Light guide layer 78 may be formed from a transparent material such as clear glass or plastic. During operation of backlight structures 42, a light source such as light source 72 may generate light 74. Light source 72 may be, for example, an array of light-emitting diodes (e.g., a series of light-emitting diodes that are arranged in a row that extends into the page in the orientation of FIG. 2). The array of light-emitting diodes may be mounted to a rigid or flexible printed circuit. The printed circuit may be adhered to adjacent layers in the electronic device. In certain embodiments, the printed circuit may be adhered to portions of light guide layer 78.

Light 74 from light source 72 may be coupled into edge surface 76 of light guide layer 78 and may be distributed in dimensions X and Y throughout light guide layer 78 due to the principal of total internal reflection. Light guide layer 78 may include light-scattering features such as pits, bumps, grooves, or ridges that help light exit light guide layer 78 for use as backlight 44. These features may be located on an upper surface and/or on an opposing lower surface of light guide layer 78. With one illustrative configuration, a first surface such as the lower surface of light guide layer 78 has a pattern of bumps and an opposing second surface such as the upper surface of light guide layer 78 has a pattern of ridges (sometimes referred to as lenticules, lenticular structures, or lenticular ridges). Light source 72 may be located at any desired edge of light guide layer 78.

Light 74 that scatters upwards in direction Z from light guide layer 78 may serve as backlight 44 for display 14. Light 74 that scatters downwards may be reflected back in the upward direction by reflector 80. Reflector 80 may be formed from a reflective structure such as a substrate layer of plastic coated with a dielectric mirror formed from alternating high-index-of-refraction and low-index-of-refraction inorganic or organic layers. Reflector 80 may be formed from a reflective material such as a layer of white plastic or other shiny materials.

To enhance backlight performance for backlight structures 42, backlight structures 42 may include optical films 70. Optical films 70 may include diffuser layers for helping to homogenize backlight 44 and thereby reduce hotspots. Optical films 70 may also include brightness enhancement films for collimating backlight 44. Optical films 70 may overlap the other structures in backlight unit 42 such as light guide layer 78 and reflector 80. For example, if light guide layer 78 has a rectangular footprint in the X-Y plane of FIG. 2, optical films 70 and reflector 80 may each have a matching rectangular footprint. Optical films 70 may include compensation films for enhancing off-axis viewing or compensation films may be formed within the polarizer layers of display 14 or elsewhere in display 14.

Figure 3:
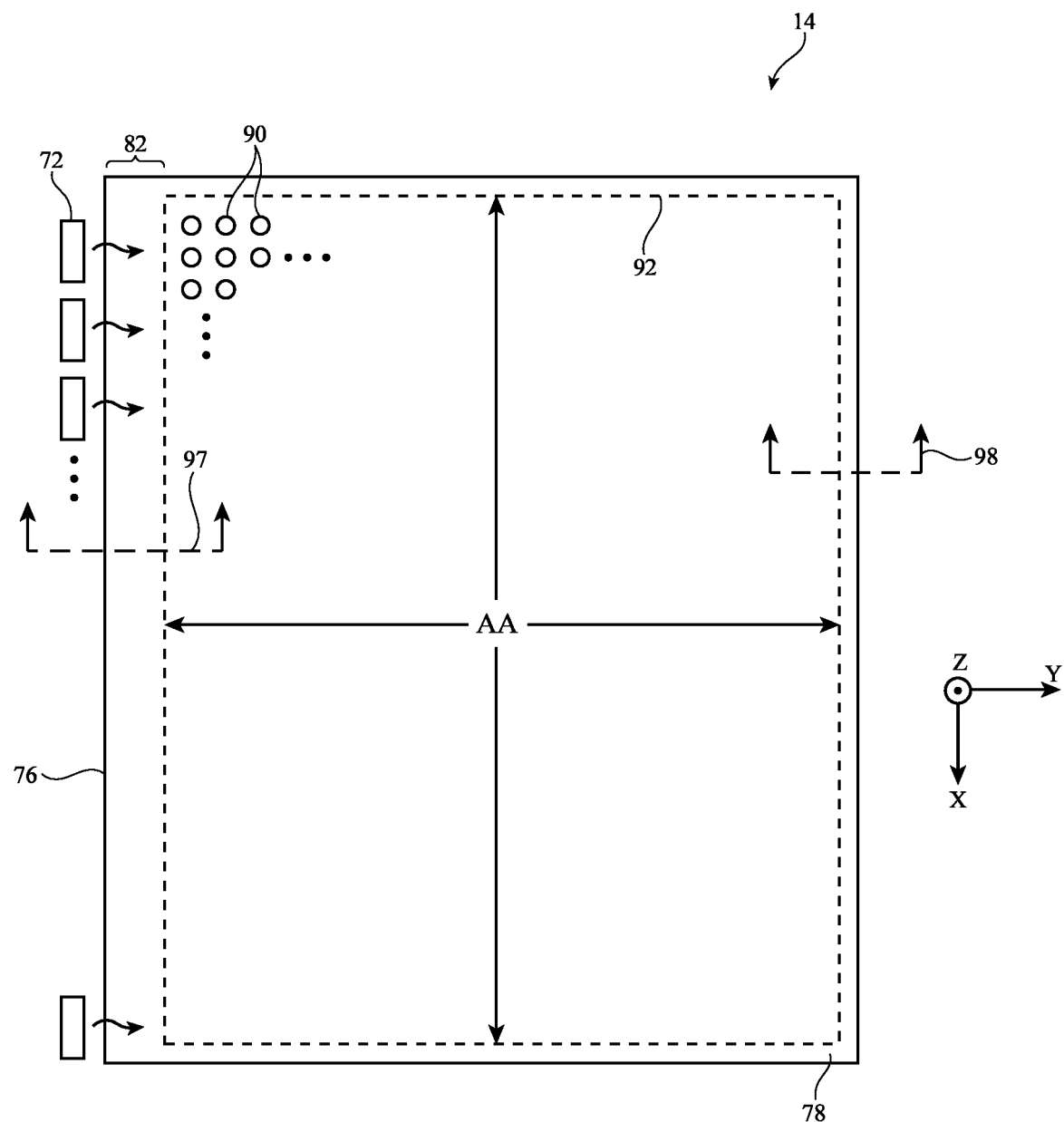
FIG. 3 is a top view of an illustrative display in accordance with an embodiment.

FIG. 3 is a top view of a portion of display 14 showing how display 14 may have an array of pixels 90 formed within display layers 46. Pixels 90 may have color filter elements of different colors such as red color filter elements, green color filter elements, and blue color filter elements. Pixels 90 may be arranged in rows and columns and may form active area AA of display 14. The borders of active area AA may be slightly inboard of the borders of light-guide layer 78 to ensure that there are no visible hotspots in display 14 (i.e., no areas in which the backlight illumination for display 14 is noticeably brighter than surrounding areas). For example, border 92 of active area AA may be offset by a distance 82 from left edge 76 of light guide layer 78.

It is generally desirable to minimize the size of distance 82 so that display 14 is as compact as possible for a given active area size. This minimizes the size of the inactive area (IA) of the display. Nevertheless, distance 82 should not be too small to ensure that there is adequate light mixing. In particular, distance 82 should be sufficiently large to allow light 74 that is emitted from light-emitting diodes 72 to homogenize enough to serve as backlight illumination. Distance 82 is often as long as necessary to ensure light from light-emitting diodes 72 is sufficiently mixed. Accordingly, distance 82 may sometimes be referred to as mixing distance 82. When light 74 is initially emitted from individual light-emitting diodes 72, light 74 is concentrated at the exits of light-emitting diodes 72 and is absent in the spaces between light-emitting diodes 72. After light 74 has propagated sufficiently far within light-guide plate 78 (i.e., after light 74 has traversed a sufficiently large mixing distance 82), light 74 will be smoothly distributed along dimension X and will no longer be concentrated near the exits of respective individual light-emitting diodes 72. To minimize mixing distance 82, light-emitting diodes 72 may be positioned close together such that the light-emitting diodes approximate a line source instead of separate point sources.

The rectangular shape of light guide layer 78 and active area AA in FIG. 3 is merely illustrative. If desired, light guide layer 78 and/or the active area AA may have a non-rectangular shape (e.g., a shape with one or more curved portions). For example, the active area and/or light guide layer may have a rectangular outline with rounded corners. The active area and/or light guide layer may have a notch along an upper edge that accommodates additional components such as sensors. The active area and light guide layer may have different shapes if desired. For example, the light guide layer may have a rectangular shape with right-angled corners (as shown in FIG. 3) whereas the active area may have a rectangular shape with rounded corners.

Figure 4:
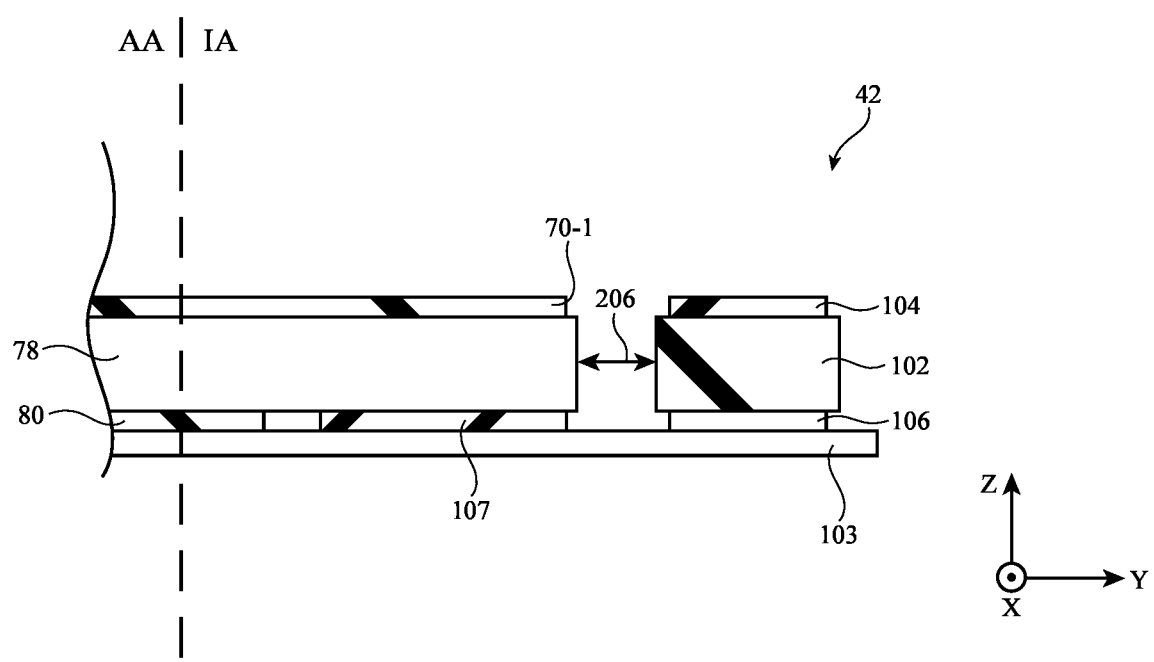
FIG. 4 is a cross-sectional side view of illustrative backlight structures showing the edge of a light guide film adjacent to a plastic chassis in accordance with an embodiment.
Figure 5:
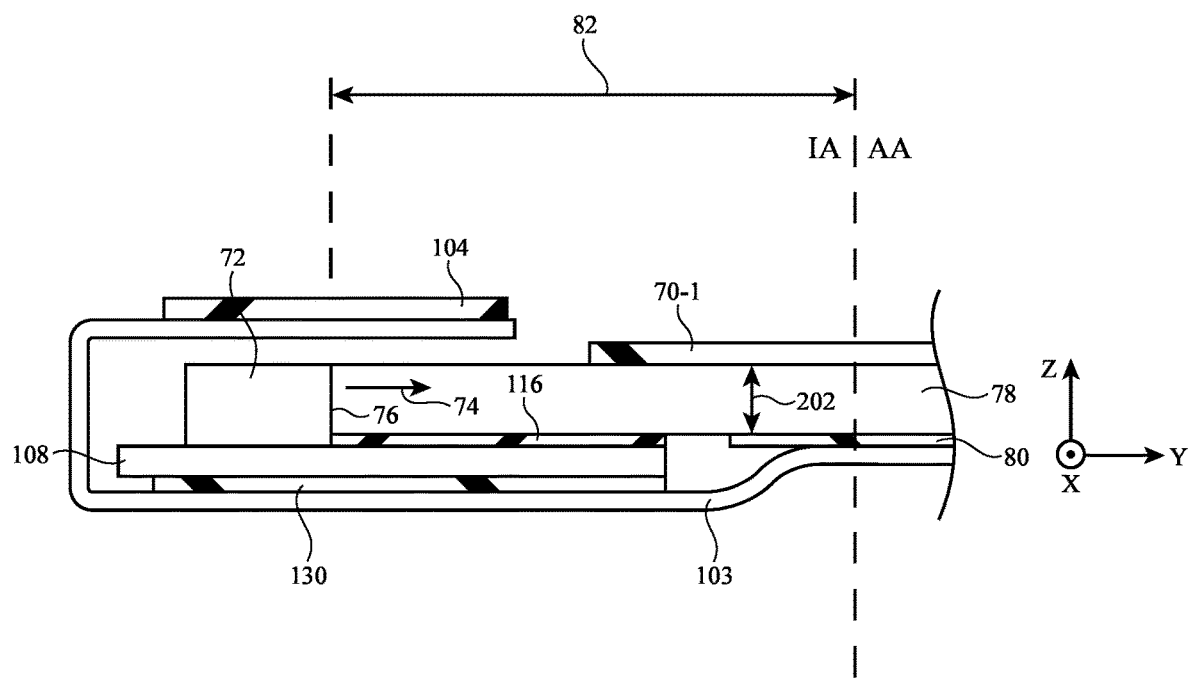
FIG. 5 is a cross-sectional side view of illustrative backlight structures showing a light-emitting diode that emits light into the edge of a light guide film in accordance with an embodiment.

Detailed cross-sections of backlight structures 42 are shown in FIGS. 4 and 5. In particular, FIG. 4 is a cross-sectional side view of backlight structures 42 taken along line 98 in FIG. 3. FIG. 5 is a cross-sectional side view of backlight structures 42 taken along line 97 in FIG. 3.

As shown in FIG. 4, backlight structures 42 include light guide layer 78 and a reflector 80 attached to a lower surface of the light guide layer. Optical film 70-1 may be placed on an upper surface of the light guide layer. Optical film 70-1 may be a turning film that directs light from the light guide layer vertically towards the overlying display layers. The optical film may be matte and therefore may sometimes be referred to as matte turning film 70-1. Any desired additional optical films may be incorporated above turning film 70-1. For example, a diffuser layer may be incorporated on an upper surface of turning film 70-1 (or positioned above 70-1 and separated from the upper surface of the turning film). In general, any desired additional optical films may be incorporated above optical film 70-1 in any desired locations (e.g., positioned directly on the underlying optical film or separated from the underlying optical film by a gap). Turning film 70-1 may help homogenize the backlight and ensure that the light is directed vertically towards the viewer. The turning film may also be used to control the viewing angle of the display.

Backlight structures 42 also include chassis 102. Chassis 102 may be a plastic chassis (sometimes referred to as a p-chassis) that supports other layers (e.g., layers in backlight structures 42 and/or display layers 46) in the display. Chassis 102 may extend around the periphery of light guide layer 78 with a central opening in which the light guide layer 78 is positioned (e.g., chassis 102 may be ring-shaped). If desired, chassis 102 may be formed from two or more types of material. For example, chassis 102 may be formed from two or more shots of molded plastic having different colors. This example is merely illustrative and chassis 102 may be formed from a single dielectric material if desired.

Backlight structures 42 may include an additional chassis 103. Chassis 103 may be a metal chassis (sometimes referred to as an m-chassis) that supports other layers (e.g., layers in backlight structures 42 and/or display layers 46) in the display. Chassis 103 may extend under the entire light guide layer 78 if desired (instead of having a ring-shape like chassis 102). In an alternate embodiment, however, chassis 103 may also be ring-shaped. An additional adhesive layer 107 may be interposed between an edge of light guide layer 78 and metal chassis 103.

Adhesive layer 104 may be attached to a top surface of chassis 102. Adhesive layer 104 may optionally be attached to a top surface of optical film 70-1. Adhesive layer 104 may extend around the periphery of light guide layer 78 and may have a central opening (e.g., adhesive layer 104 may be ring-shaped). Adhesive layer 104 may therefore sometimes be referred to as ring tape. Ring tape 104 may attach backlight structures 42 to display layers 46 if desired. Ring tape may alternatively attach chassis 102 to other layers (e.g., optical films) within backlight structures 42. Another adhesive layer 106 may attach a lower surface of chassis 102 to an upper surface of chassis 103. Adhesive layers 104 and 106 may be pressure sensitive adhesive layers or any other desired type of adhesive layers.

To minimize the width of the inactive area of the display, the distance 206 between chassis 102 and light guide layer 78 may be minimized. For example, distance 206 may be less than 1 millimeter, less than 0.5 millimeters, less than 0.4 millimeters, less than 0.3 millimeters, between 0.2 and 0.5 millimeters, between 0.3 and 0.4 millimeters, between 0.25 and 0.35 millimeters, greater than 0.2 millimeters, etc.

The three edges of backlight structures 42 that do not include light-emitting diodes 72 may have cross-sections of the type shown in FIG. 4. For example, looking at FIG. 3, light-emitting diodes 72 are positioned along a left edge of the light guide layer. The left edge of the backlight structures has a different arrangement than the remaining three edges of the backlight structures. The remaining three edges of the backlight structures may have an arrangement of the type shown in FIG. 4. The example of the light-emitting diodes being positioned along the left edge of the light guide layer is merely illustrative. The light-emitting diodes may be positioned along any edge (or more than one edge) of the light guide layer.

FIG. 5 is a cross-sectional side view of the left edge of the backlight structures where the light sources emit light into the light guide layer. As shown in FIG. 5, this portion of the backlight structures still includes light guide layer 78, a reflector layer 80 attached to a lower surface of the light guide layer, and an optical film such as turning film 70-1 attached to an upper surface of the light guide layer. However, light sources 72 may be included to emit light 74 in the Y-direction through edge surface 76 of the light guide layer.

Light sources 72 may be light-emitting diodes that are arranged in a row along the edge surface 76 of the light guide layer. Each light-emitting diode 72 may be mounted on a printed circuit board such as flexible printed circuit board 108. Flexible printed circuit board 108 may be a printed circuit formed from sheets of polyimide or other flexible polymer layers. Flexible printed circuit board 108 (sometimes referred to as flexible printed circuit 108 or printed circuit 108) may include patterned metal traces for carrying signals between components on the flexible printed circuit board. Flexible printed circuit board 108 may optionally include contact pads (e.g., solder pads) on an upper surface of the flexible printed circuit board. Solder may be used to couple the light-emitting diodes to solder pads on the flexible printed circuit board. Each light-emitting diode (sometimes referred to as a light-emitting diode package) may have one or more associated solder pads. The solder may electrically and mechanically connect the light-emitting diodes to flexible printed circuit board. Optionally, an additional adhesive layer may be attached to both the upper surface of the light-emitting diodes 72 and the upper surface of light guide layer 78.

Flexible printed circuit board 108 may also be coupled to light guide layer 78 by an additional adhesive layer. As shown in FIG. 5, flexible printed circuit board 108 may include an adhesive layer 116 that is attached between light guide layer 78 and flexible printed circuit 108. Adhesive layer 116 may be a pressure sensitive adhesive layer or any other desired type of adhesive layer.

Ring tape 104 may be attached to an upper surface of chassis 103. Chassis 103 may be attached to a lower surface of flexible printed circuit 108 by adhesive layer 130. Adhesive layer 130 may be a pressure sensitive adhesive layer or any other desired type of adhesive layer. Backlight structures 42 may also include one or more additional adhesive layers that attach chassis 103 to reflector layer 80.

The light guide layer 78 of the backlight structures in FIGS. 4 and 5 may be a light guide film (LGF) formed from a polymer material such as polycarbonate. Using a polycarbonate light guide film may result in the light guide layer having a small thickness 202 (see FIG. 5). For example, thickness 202 may be less than 1 millimeter, less than 0.5 millimeters, less than 0.4 millimeters, less than 0.3 millimeters, between 0.2 and 0.5 millimeters, between 0.3 and 0.4 millimeters, between 0.35 and 0.40 millimeters, greater than 0.2 millimeters, etc.

Additionally, the arrangement of FIG. 5 minimizes the mixing distance 82 between light-emitting diodes 72 and the active area of the display. For example, distance 82 may be less than 5.0 millimeters, less than 4.0 millimeters, less than 3.5 millimeters, less than 3.0 millimeters, less than 2.0 millimeters, greater than 1.0 millimeter, between 2.0 and 4.0 millimeters, between 2.5 and 3.5 millimeters, etc.

The small mixing distance in FIG. 5 may be a result of having light-emitting diodes 72 be positioned close together on flexible printed circuit 108. By positioning the light-emitting diodes close together, the light emitted from the light-emitting diodes will better approximate a uniform line light source rather than separate point light sources.

Figure 6:
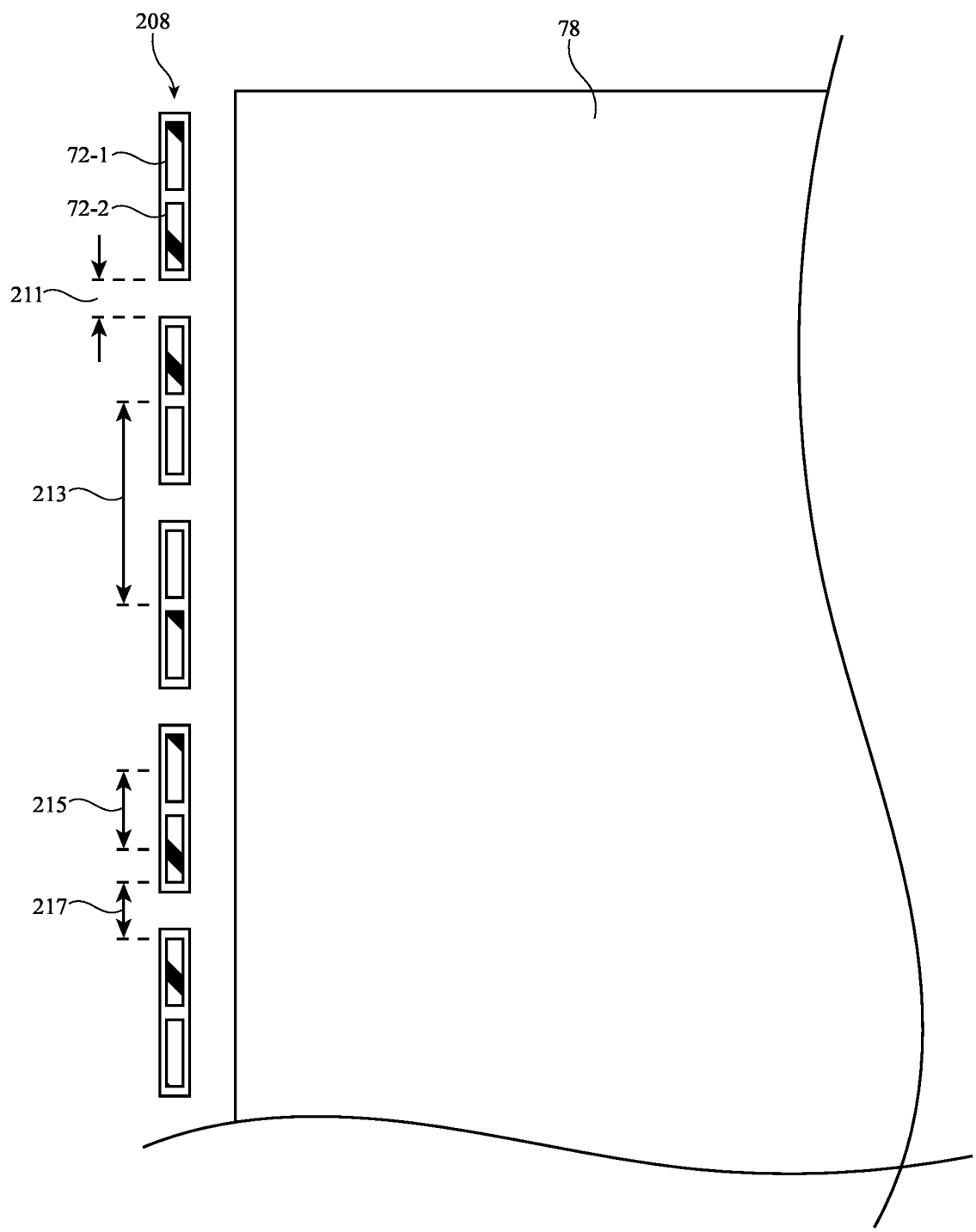
FIG. 6 is a top view of illustrative backlight structures showing light-emitting diode packages that each include first and second light-emitting diodes in accordance with an embodiment.

FIG. 6 is a top view of backlight structures illustrating how the light-emitting diode packages may be positioned close together to minimize mixing distance. As shown in FIG. 6, each light-emitting diode package 208 may include first and second light-emitting diodes 72-1 and 72-2. The edge-to-edge distance between adjacent light-emitting diode packages (e.g., distance 211) may be less than 1 millimeter, less than 0.5 millimeters, less than 0.4 millimeters, less than 0.3 millimeters, between 0.2 and 0.5 millimeters, between 0.3 and 0.4 millimeters, between 0.25 and 0.35 millimeters, greater than 0.2 millimeters, etc. The pitch of the light-emitting diode packages 208 (e.g., the center-to-center distance 213 between adjacent light-emitting diode packages) may be less than 5.0 millimeters, less than 4.0 millimeters, less than 3.5 millimeters, less than 3.0 millimeters, less than 2.0 millimeters, greater than 1.0 millimeter, between 2.0 and 4.0 millimeters, between 2.5 and 3.5 millimeters, between 3.0 and 4.0 millimeters, between 3.0 and 3.5 millimeters, etc. The pitch of the light-emitting diodes (e.g., the center-to-center distance 215 between adjacent light-emitting diodes) may be less than 4.0 millimeters, less than 3.0 millimeters, less than 2.0 millimeters, less than 1.5 millimeters, less than 1.0 millimeters, greater than 1.0 millimeter, between 1.0 and 2.0 millimeters, between 1.0 and 2.5 millimeters, between 1.5 and 2.0 millimeters, etc. The edge-to-edge distance between adjacent light-emitting diodes (e.g., distance 217) may be less than 1 millimeter, less than 0.8 millimeters, less than 0.6 millimeters, less than 0.4 millimeters, between 0.4 and 0.6 millimeters, between 0.45 and 0.55 millimeters, greater than 0.3 millimeters, etc.

Figure 7:
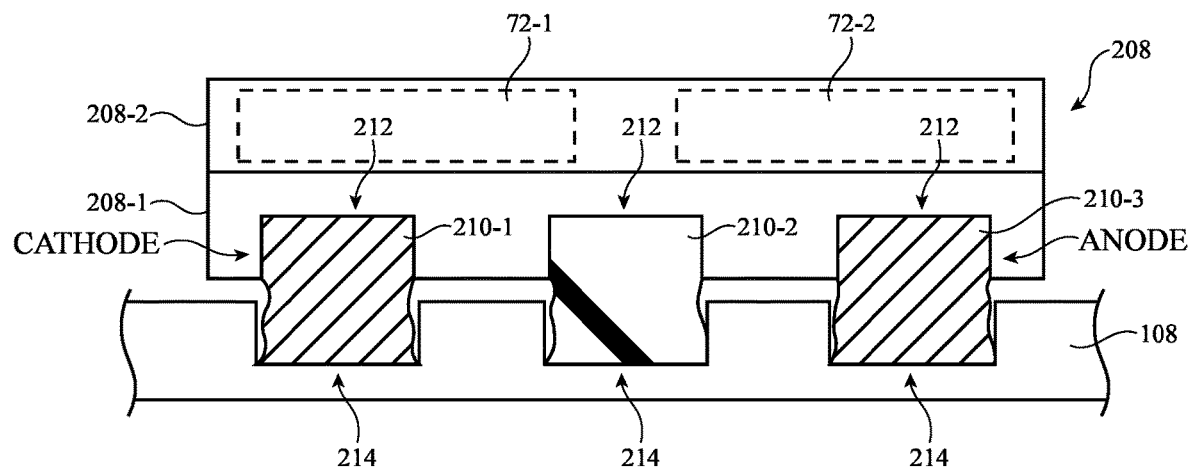
FIG. 7 is a cross-sectional side view of an illustrative light-emitting diode package that includes first and second light-emitting diodes and that is flip chip bonded to a flexible printed circuit in accordance with an embodiment.

To form the light-emitting diode packages close together as in FIG. 6, the light-emitting diode packages may be flip chip bonded to the underlying flexible printed circuit board (108). An example of this type is shown in FIG. 7. As shown in FIG. 7, the light-emitting diode package 208 may be attached to flexible printed circuit board 108 using first, second, and third flip chip bumps 210-1, 210-2, and 210-3. Each flip chip bump may be formed from solder and therefore may sometimes be referred to as a solder ball.

Light-emitting diode package 208 may have three recesses 212 formed in a first portion 208-1 of the light-emitting diode package. Each recess may receive a corresponding solder ball 210. The second portion 208-2 of the light-emitting diode package may include first and second light-emitting diodes 72-1 and 72-2. The light-emitting diodes 72-1 and 72-2 may be coupled in series between a corresponding anode (e.g., solder ball 210-3) and cathode (e.g., solder all 210-1). The intervening solder ball 210-2 may serve as a heat sink and may allow individual testing of light-emitting diodes 72-1 and 72-2.

A solder pad may be included in each recess 212 to electrically connect the light-emitting diode package to the solder balls. Flexible printed circuit board 108 may have corresponding recesses 214, each of which receives a solder ball. A solder pad may be included in each recess 214 to electrically connect the flexible printed circuit board to the solder balls. The example in FIG. 7 of both light-emitting diode package 208 and flexible printed circuit board 108 having recesses to receive the solder balls is merely illustrative. In general, recesses may be formed on none, one, or both of the light-emitting diode package 208 and flexible printed circuit board 108 for each solder ball.

The recesses 214 may have larger widths than their corresponding recesses 212. Additionally, the recess 212 associated with solder ball 210-2 may be wider than the recesses 212 associated with solder balls 210-1 and 210-3. Similarly the recess 214 associated with solder ball 210-2 may be wider than the recesses 214 associated with solder balls 210-1 and 210-3.

Figure 8:
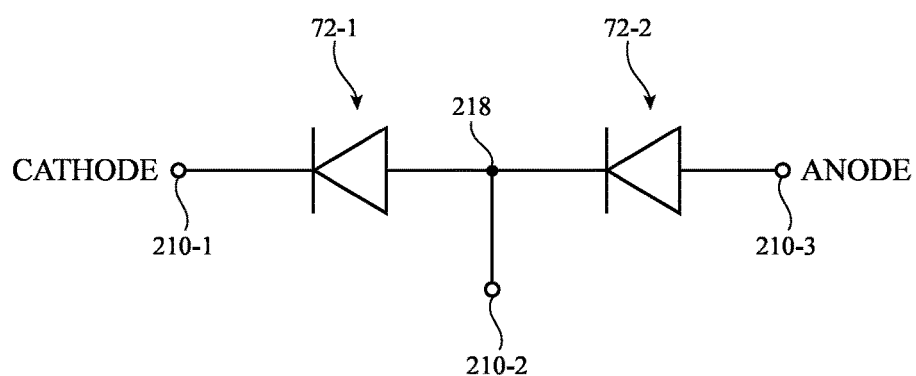
FIG. 8 is a circuit diagram of an illustrative light-emitting diode package that includes first and second light-emitting diodes in accordance with an embodiment.

FIG. 8 is a circuit diagram showing the circuit associated with light-emitting diode package 208 of FIG. 7. As shown, light-emitting diodes 72-1 and 72-2 are coupled in series between the anode and the cathode. Solder ball 210-1 may be coupled to the cathode voltage whereas solder ball 210-3 may be coupled to the anode voltage. Solder ball 210-2 may be coupled to a node 218 between the light-emitting diodes 72-1 and 72-2. A voltage for testing one of the light-emitting diodes may optionally be coupled to solder ball 210-2.

Figure 9:
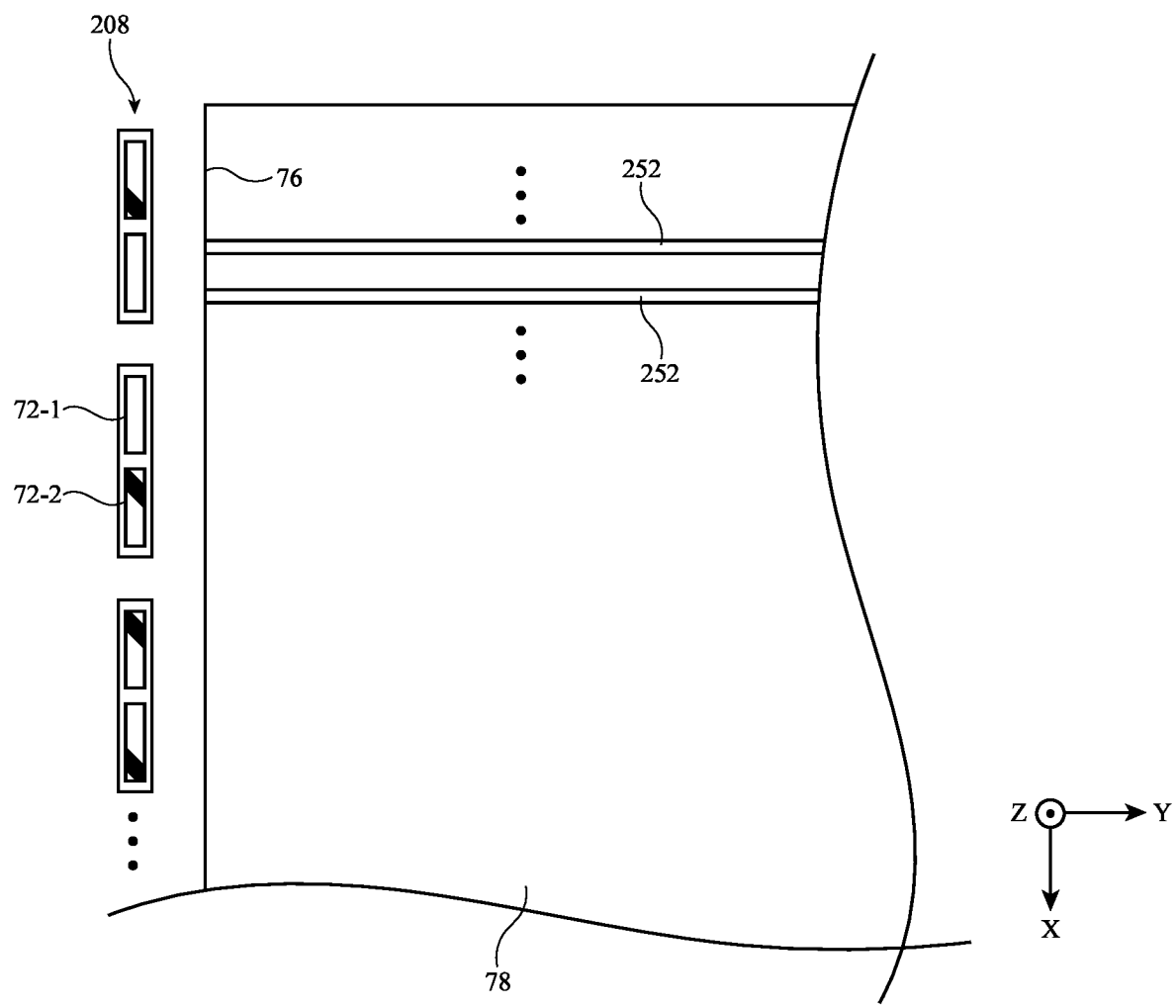
FIG. 9 is a top view of an illustrative light guide layer that includes light-scattering features that extend across the light guide layer in accordance with an embodiment.

As previously mentioned, light guide layer 78 may have light-scattering features such as pits, bumps, grooves, or ridges that help light exit light guide layer 78 for use as backlight 44. Light guide layer 78 may work in combination with turning film 70-1 to ensure that backlight 44 is provided to the display layers 46 in a desired direction at a desired viewing angle. FIG. 9 is a top view of light guide layer 78 showing how the light guide layer 78 may have light-scattering features 252 (sometimes referred to as light-scattering structures) that extend along a longitudinal axis orthogonal to the edge 76 of the light guide layer that receives light from light-emitting diode packages 208. Light-scattering structures 252 extend parallel to the direction in which light is emitted from the light-emitting diodes. Light-scattering features 252 may extend entirely across the light guide layer or may only extend partially across the light guide layer. The density of light-scattering structures 252 may be uniform across the light guide layer or may vary across the light guide layer (e.g., may vary along the X-axis and/or Y-axis). Light-scattering structures 252 may sometimes be referred to as lenticular light-scattering structures.

Figure 10:
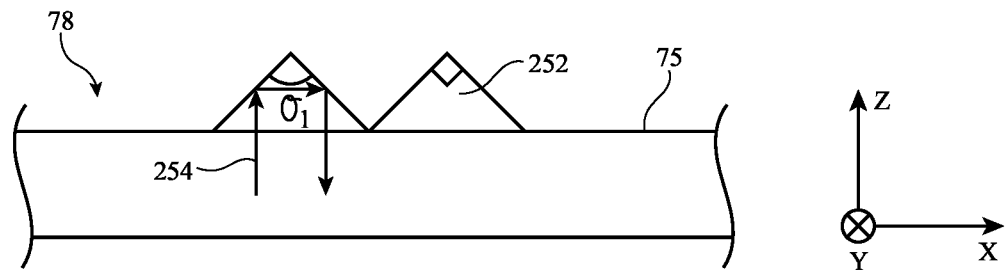
FIG. 10 is a cross-sectional side view of illustrative light-scattering features having a cross-sectional shape of a right triangle with a ninety degree angle in accordance with an embodiment.

Light-scattering structures 252 may have any desired shape. FIG. 10 is a cross-sectional side view of a light guiding layer 78 having light-scattering structures 252 with a triangular cross-sectional shape. As shown in FIG. 10, the light-scattering structures are formed on an upper surface 75 of the light guide layer. The light-scattering structures may be formed from the same material as the light guide layer (and therefore may be formed integrally with the light guide layer) or may be formed from a different material than the light guide layer.

Figure 11:
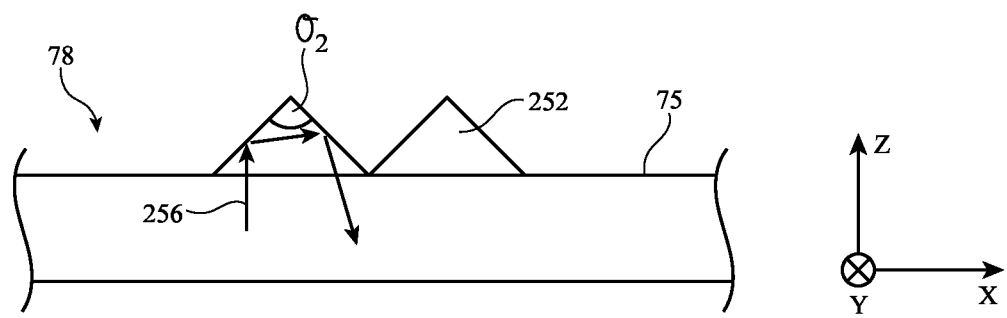
FIG. 11 is a cross-sectional side view of illustrative light-scattering features having a cross-sectional shape of a triangle with an angle greater than ninety degrees in accordance with an embodiment.

The triangular light-scattering structures have first and second surfaces that meet at a vertex defined by angle $\theta_1$. In FIG. 10, $\theta_1$ is equal to 90 degrees (e.g., the triangular cross-section is a right triangle). Light may reflect off of the surfaces of the light-scattering structure due to total internal reflection. As shown in FIG. 10, light that starts in the positive Z-direction will be reflected by light-scattering structure 252 and follow path 254. When the light-scattering structure has a triangular cross-section with a right-angle the light may not be mixed effectively. In FIG. 11, the light-scattering structures are characterized by an angle $\theta_2$ that is greater than 90°. For example, $\theta_2$ may be greater than 100°, greater than 110°, greater than 120°, greater than 135°, between 91° and 110°, between 95° and 105°, greater than 95°, less than 145°, etc. Light that starts in the positive Z-direction will be reflected by light-scattering structure 252 and follow path 256. As shown in FIG. 11, when the angle $\theta_2$ is greater than 90°, light may be mixed more than in FIG. 10 when the angle is equal to 90°.

Figure 12:
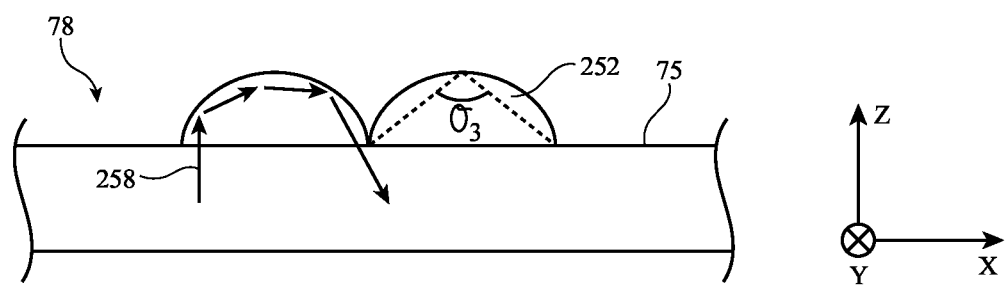
FIG. 12 is a cross-sectional side view of illustrative light-scattering features having a cross-sectional shape with a curved upper surface in accordance with an embodiment.

FIG. 12 is a cross-sectional side view of a light guiding layer 78 having light-scattering structures 252 with a semi-circular cross-sectional shape. As shown in FIG. 12, the light-scattering structures are formed on an upper surface 75 of the light guide layer. The light-scattering structures may be formed from the same material as the light guide layer (and therefore may be formed integrally with the light guide layer) or may be formed from a different material than the light guide layer. The light-scattering structures have an upper surface that is curved. The upper surface may have a uniform radius of curvature across the cross-section of the light-scattering structure (e.g., as in a semi-circular cross-section). The upper surface may also have a non-uniform radius of curvature across the cross-section of the light-scattering structure. The radius of curvature may vary along the length of the light-scattering structure if desired.

The shape of the light-scattering structure in FIG. 12 may also mix the light more effectively than the light-scattering structures in FIG. 10. Light that starts in the positive Z-direction will be reflected by light-scattering structure 252 and follow path 258. Even when the light-scattering structure has a curved upper surface, the light-scattering structure may be characterized by an angle $\theta_3$. The angle $\theta_3$ associated with the curved cross-sectional shape may be the angle of the vertex of a triangle drawn between the top-most point of the curved upper surface and the edges of the curved upper surface (at the point they meet the planar upper surface 75 of the light guide layer). The angle $\theta_3$ may be greater than 90° to promote light mixing. For example, $\theta_3$ may be greater than 100°, greater than 110°, greater than 120°, greater than 135°, between 91° and 110°, between 95° and 105°, greater than 95°, less than 145°, etc.

If desired, the light-scattering structures 252 on the upper surface of light guide layer 78 may vary in shape. As shown in FIG. 13, light-scattering structures 252-1 having a first shape may alternate with light-scattering structures 252-2 having a second shape. The first light-scattering structures 252-1 may have a first height 260 that is greater than the height 262 of the second light-scattering structures 252-2. Alternating the light-scattering structures in this way may improve the light mixing within the light guide layer.

Both light-scattering structures 252-1 and light-scattering structures 252-2 may have an associated angle $\theta$. Light-scattering structures 252-1 have an associated angle $\theta_1$ whereas light scattering structures 252-2 have an associated angle $\theta_2$. In this example, light-scattering structures 252-1 and light-scattering structures 252-2 have the same width. Therefore, because height 260 is greater than height 262, angle $\theta_1$ is less than angle $\theta_2$. However, both angles $\theta_1$ and $\theta_2$ may be greater than 90°. The difference between angles $\theta_1$ and $\theta_2$ may be greater than 5°, greater than 10°, greater than 20°, less than 25°, etc.

FIG. 14 shows yet another example for a cross-sectional shape of light-scattering structures 252. As shown in FIG. 14, the light-scattering structures may have a triangular shape with a rounded tip. Each light-scattering structure includes a planar surface 264, a planar surface 266, and a curved surface 268 (sometimes referred to as rounded surface 268, rounded tip 268, rounded vertex 268, etc.) interposed between the planar surfaces 264 and 266. Having the rounded tip 268 instead of an angled vertex may improve light mixing. The angle $\theta$ associated with each light-scattering structure may be greater than 90° to promote light mixing. For example, θ may be greater than 100°, greater than 110°, greater than 120°, greater than 135°, between 91° and 110°, between 95° and 105°, greater than 95°, less than 145°, etc.

In general, each light-scattering structure may have any desired structure. The light-scattering structures may have different structures, the same structures, structures that vary in any desired pattern, etc. The light-scattering structures may themselves have a uniform cross-sectional shape or a cross-sectional shape that varies along the length of the light-scattering structure. The light-scattering structures may be formed on the upper surface of the light guide layer and/or the lower surface of the light guide layer. Any of the potential light-scattering structure arrangements described herein may be used in the light guide layer of FIGS. 4 and 5.

Figure 15:
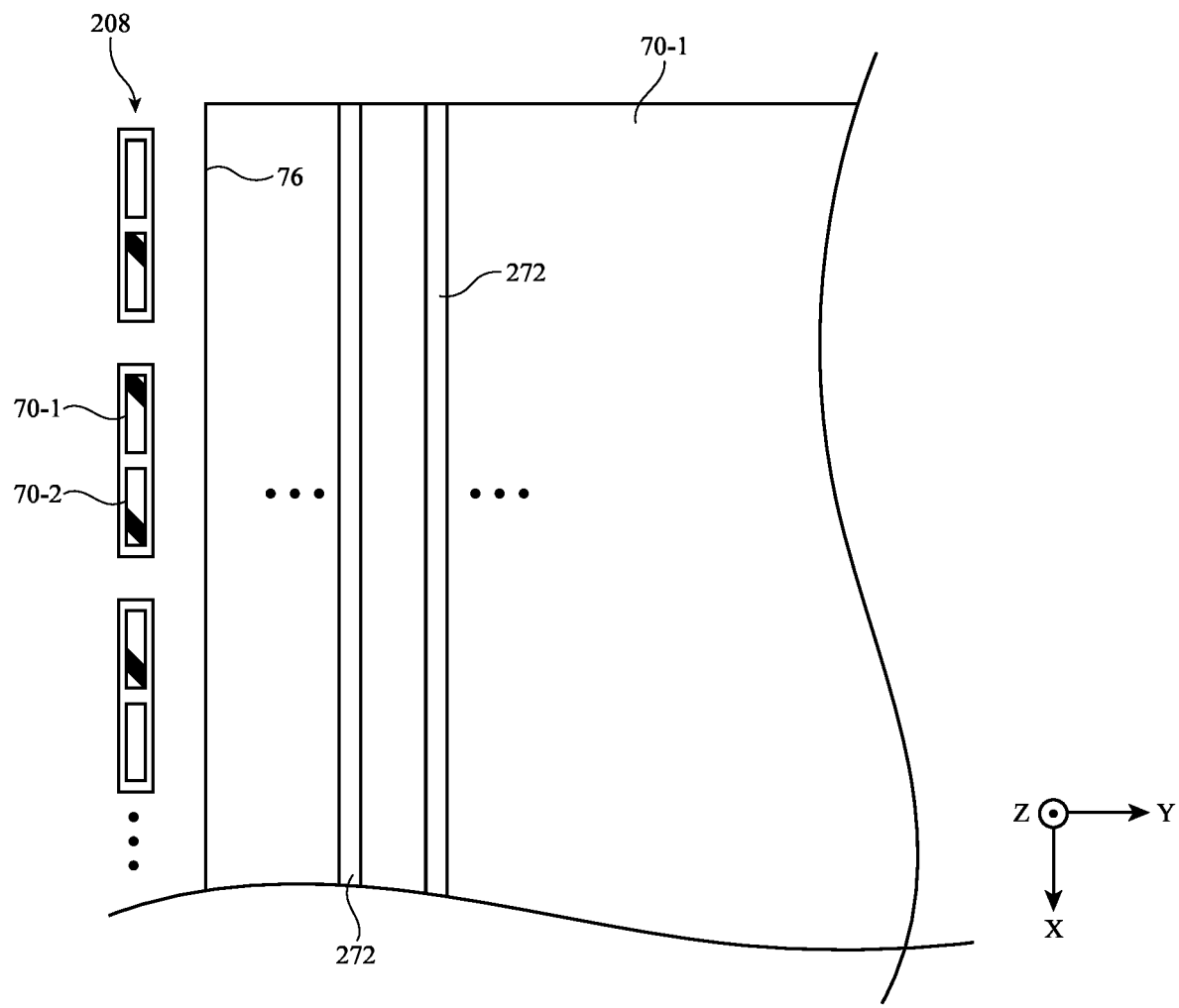
FIG. 15 is a top view of an illustrative turning film that includes prisms that extend across the turning film in accordance with an embodiment.

Turning film 70-1 (see FIGS. 4 and 5) may also have light-redirecting features such as pits, bumps, grooves, ridges, or prisms that help redirect light in a desired direction for use as backlight 44. FIG. 15 is a top view of turning film 70-1 showing how the turning film 70-1 may have prisms 272 that extend along a longitudinal axis parallel to the edge 76 of the light guide layer that receives light from light-emitting diode packages 208. Prisms 272 are orthogonal to the direction in which light is emitted from the light-emitting diodes. Prisms 272 may extend entirely across the light guide layer or may only extend partially across the light guide layer. The density of prisms 272 may be uniform across the light guide layer or may vary across the light guide layer (e.g., may vary along the X-axis and/or Y-axis).

Figure 16:
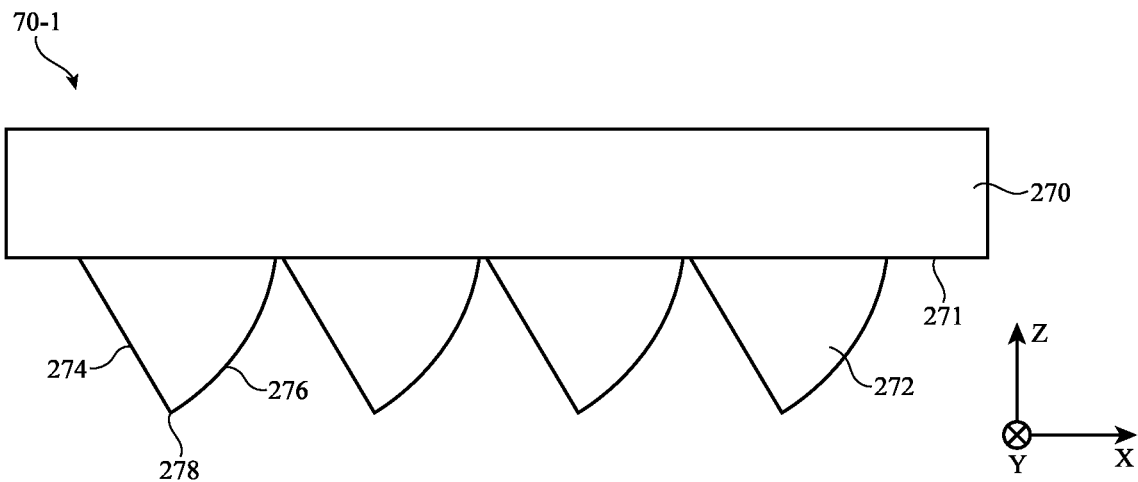
FIG. 16 is a cross-sectional side view of illustrative prims having a cross-sectional shape with one planar surface and one curved surface in accordance with an embodiment.

Prisms 272 may have any desired shape. FIG. 16 shows an illustrative example of a cross-sectional shape for prisms 272. As shown in FIG. 16, optical film 70-1 may include a base film portion 270 with prisms 272 extending from a lower surface 271 of the base film portion 270. The prisms 272 in FIG. 16 may be formed from the same material as base film portion 270 or a different material than base film portion 270. Each prism 272 in FIG. 16 has a planar surface 274 that meets a curved surface 276 at a vertex 278. Planar surface 274 may be positioned either on the side of the prism 272 closer to the light-emitting diodes or the side of the prism further from the light-emitting diodes.

Figure 17:
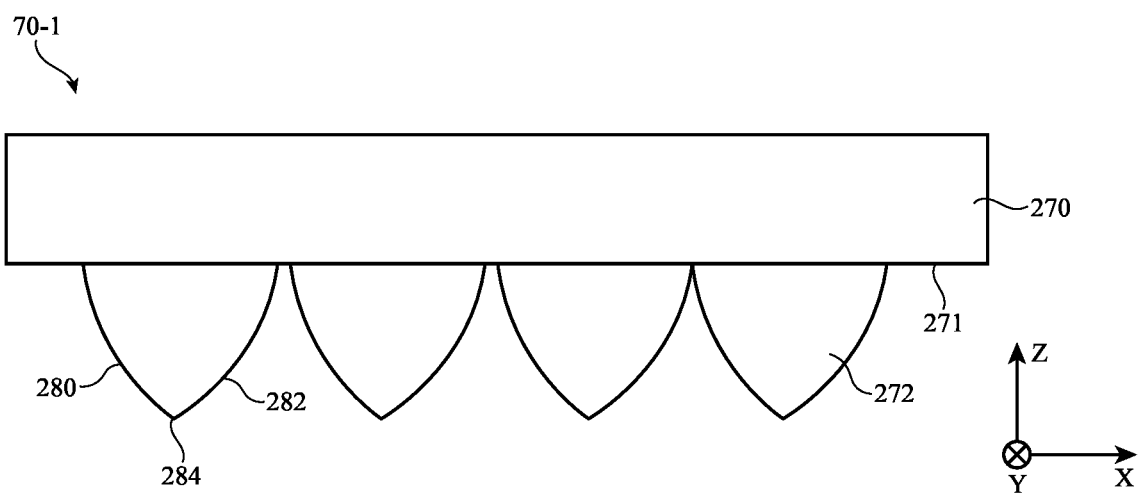
FIG. 17 is a cross-sectional side view of illustrative prims having a cross-sectional shape with two curved surfaces having the same curvature in accordance with an embodiment.
Figure 18:
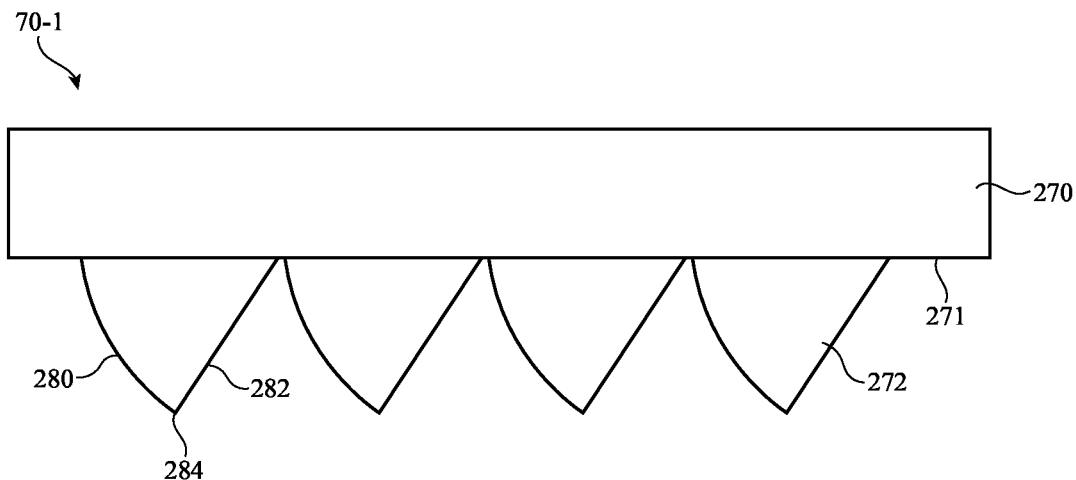
FIG. 18 is a cross-sectional side view of illustrative prims having a cross-sectional shape with two curved surfaces having different curvature in accordance with an embodiment.

FIG. 17 shows an illustrative example of a cross-sectional shape for prisms 272. As shown in FIG. 17, optical film 70-1 may include a base film portion 270 with prisms 272 extending from a lower surface 271 of the base film portion 270. The prisms 272 in FIG. 17 may be formed from the same material as base film portion 270 or a different material than base film portion 270. Each prism 272 in FIG. 17 has a curved surface 280 that meets a curved surface 282 at a vertex 284. In this example, the curvature of curved surfaces 280 and 282 is the same. However, this example is merely illustrative. In a similar example, shown in FIG. 18, the curvature of surface 280 is different than the curvature of surface 282.

Figure 19:
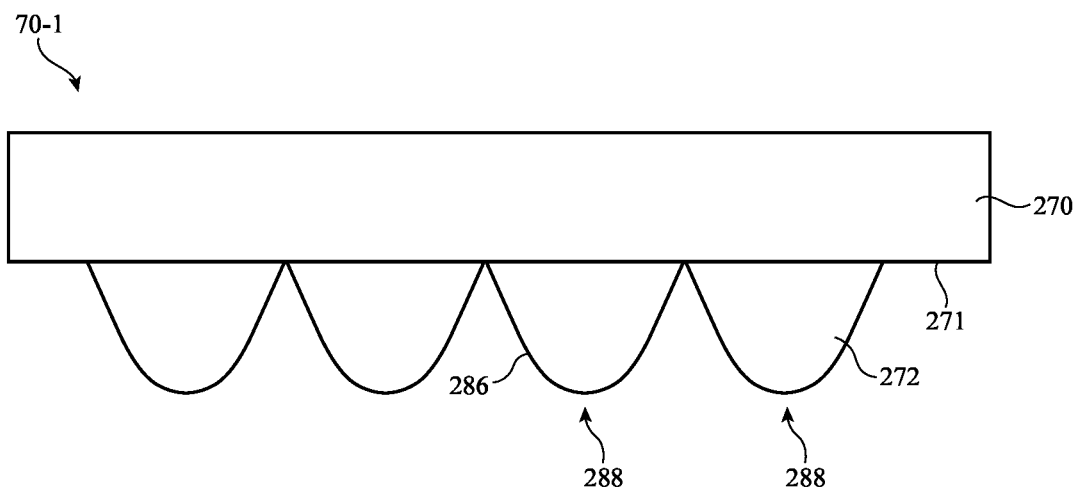
FIG. 19 is a cross-sectional side view of illustrative prims having a cross-sectional shape with a curved surface in accordance with an embodiment.

FIG. 19 shows an illustrative example of a cross-sectional shape for prisms 272. As shown in FIG. 19, optical film 70-1 may include a base film portion 270 with prisms 272 extending from a lower surface 271 of the base film portion 270. The prisms 272 in FIG. 19 may be formed from the same material as base film portion 270 or a different material than base film portion 270. Each prism 272 in FIG. 19 has a curved surface 286 with a rounded tip 288 (as opposed to the vertices of FIGS. 16-18).

In general, each prism in turning film 70-1 may have any desired structure. The prisms may have different structures, the same structures, structures that vary in any desired pattern, etc. The prisms may themselves have a uniform cross-sectional shape or a cross-sectional shape that varies along the length of the prism. The prisms may be formed on the upper surface of the light guide layer and/or the lower surface of the light guide layer. Any of the potential prism arrangements described herein may be used in the light guide layer of FIGS. 4 and 5.

Having the prisms of turning film 70-1 on the lower surface of the turning film and the light-scattering structures 252 of the light guide layer on the upper surface of the light guide layer may help prevent scratching of the layers and/or wetting between the layers. Additional structures (e.g., laser dots) may be included on the turning film (or other optical films in the electronic device) to prevent scratching and/or wetting.

Light guide layer 78 (and corresponding light-scattering structures 252) may be used to control the viewing angle of the display within the XZ-plane. For example, as shown in FIG. 9 the design of the light-scattering structures 252 may control how much the light is spread within the XZ-plane when exiting the light guide layer. Turning film 70-1 (and corresponding prisms 272) may be used to control the viewing angle of the display within the YZ-plane. For example, as shown in FIG. 15 the design of the prisms 272 may control how much the light is spread within the YZ-plane when exiting the turning film. Light guide layer 78 and turning film 70-1 therefore may be used to provide a high-viewing-angle display with a high viewing-angle both along the X-axis and along the Y-axis.

It is generally desirable for homogenous backlight to be emitted from backlight structures 42. It is also generally desirable for homogenous light to be emitted from display layers 46 when desired. For example, if all of the display pixels within the display are set to emit white light, it is desirable for the white light to be uniform across the entire display. Numerous steps may be taken to ensure uniform emission of light from display 14 in electronic device 10.

Figure 20:
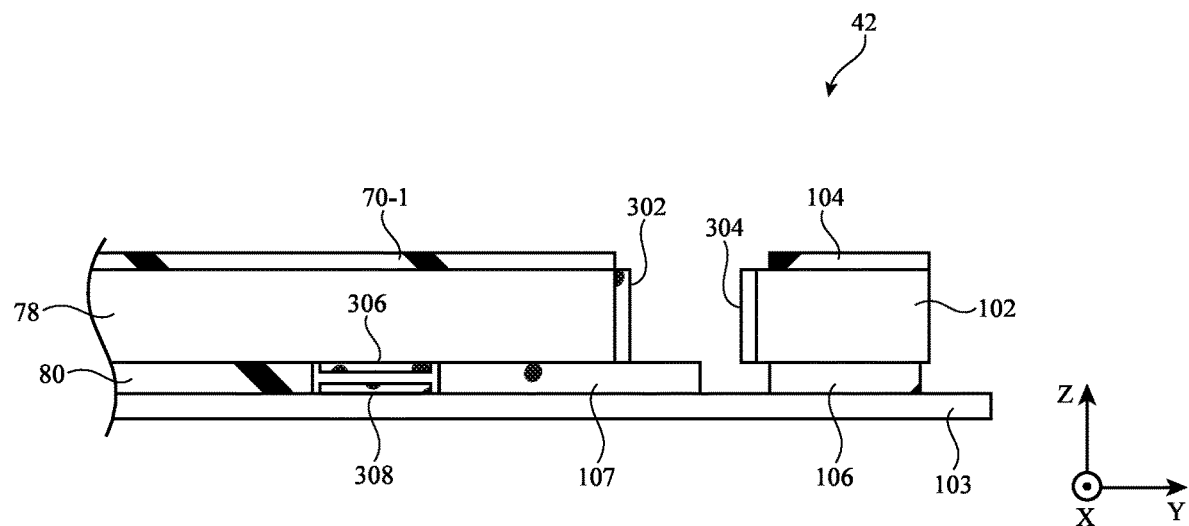
FIG. 20 is a cross-sectional side view of illustrative backlight structures including additional ink or colored layers to correct color and/or luminance variations in the emitted backlight in accordance with an embodiment.

FIG. 20 is a cross-sectional side view of backlight structures including additional ink or colored layers to correct color and/or luminance variations in the emitted backlight. Similar to FIG. 4, FIG. 20 is a cross-sectional side view of backlight structures 42 taken along line 98 in FIG. 3. In FIG. 20 additional ink layers that may be used to adjust color and/or luminance are shown.

First, adhesive layer 107 (sometimes referred to as light guide film fixing tape) may include additional ink to control the color of the adhesive layer. Gray ink may be included in or on the adhesive layer 107 to help ensure uniform luminance at the edge of the light guide layer. Alternatively, colored ink (e.g., ink that is blue, yellow, red, green, or any other desired color) may be included in or on the adhesive layer 107 to ensure uniform color of light at the edge of the light guide layer.

Other components near light guide layer 78 may have their color selected to correct color and/or luminance variations in the emitted backlight or may have an attached additional ink layer to correct color and/or luminance variations. For example, an additional ink layer 302 may be attached to the edge surface of light guide layer 78 or an additional ink layer 304 may be attached to the edge of chassis 102. The additional ink layers 302 and 304 may include gray ink or colored ink (e.g., ink that is blue, yellow, red, green, or any other desired color). The additional ink layers may be, for example, layers of tape having a specific desired color. Alternatively, ink or pigment may be added to chassis 102 itself such that the edge surface of the chassis has a specific desired color. For example, gray ink or blue ink may be added to the plastic chassis 102.

In another example, an additional ink layer 306 may be attached to the bottom surface of light guide layer 78 between reflector 80 and adhesive layer 107. Alternatively, an additional ink layer 308 may be attached to the upper surface of metal chassis 103 between reflector 80 and adhesive layer 107. The additional ink layers 306 and 308 may include gray ink or colored ink (e.g., ink that is blue, yellow, red, green, or any other desired color). The additional ink layers may be, for example, layers of tape having a specific desired color. Alternatively, ink or pigment may be added to chassis 103 such that the upper surface of the chassis has a specific desired color. For example, gray ink or blue ink may be added to the metal chassis 103. Ink layers 302, 304, 306, and 308 may be referred to as layers, coatings, ink layers, tape layers, color correcting layers, compensating layers, luminance correcting layers, or paint layers. Each layer (302, 304, 306, 308) does not necessarily need to be formed from ink. Each layer may be formed from ink, pigment, or any other material that creates a difference in color or luminance compared with the surrounding material.

These examples are merely illustrative. Additional layers having any desired color may be incorporated at any desired location within the display to correct luminance or color issues if desired.

In some cases, pixel values may be reduced (truncated) in order to correct the white point of displayed light. Additionally, sometimes during operation of the display, displayed content may need to rapidly move across the display. For example, when a user is scrolling through the display the displayed content moves rapidly across the display. To avoid visible artifacts when content is moving rapidly across the display, voltages used in operating the display may be overdriven. For example, the data lines that provide data to the display pixels or switching transistors involved in operating the display pixels may be operated with an overdriven voltage (e.g., a voltage that is higher than during normal operation). Overdriving the display pixels in this way may speed up the time it takes to refresh the pixel, reducing visible artifacts caused by transitions between brightness levels when displaying rapidly changing content.

When in the overdrive mode, pixels of a certain color may be overdriven less than other pixels to avoid visible artifacts. For example, a green shadow may be visible in situations in which content is moving rapidly across the display and truncation in red and blue pixels are high. To prevent this type of visible artifact, the green pixels may be overdriven less than the red and blue pixels (e.g., the overdrive voltage of the green pixels will be lower than the overdrive voltage for the red and blue pixels). In other words, pixels of different colors may be overdriven by different amounts to ensure that no visible artifacts are present. This concept will be described in more detail in connection with FIGS. 43-47.

Figure 21:
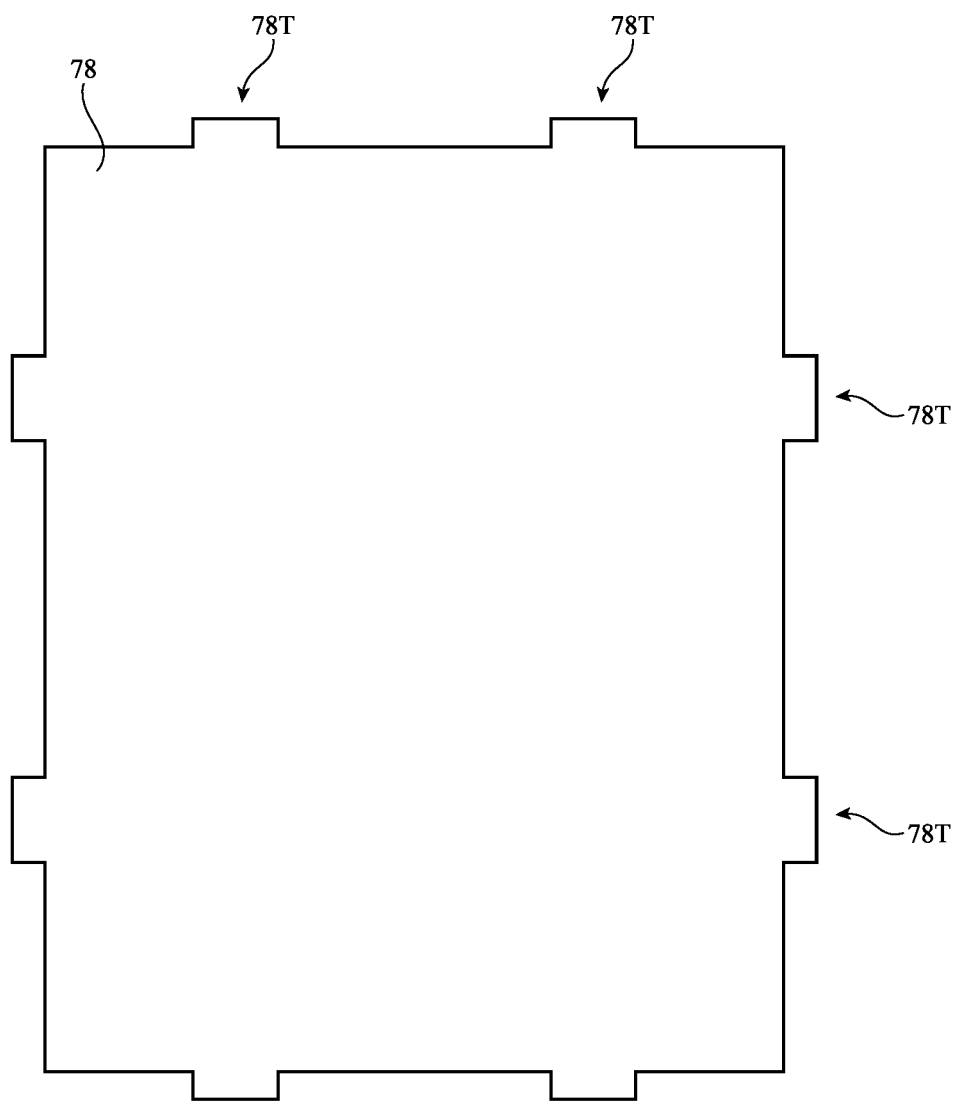
FIG. 21 is a top view of an illustrative light guide layer having tabs in accordance with an embodiment.

FIG. 21 is a top view of an illustrative light guide layer that may be included in backlight structures 42. As shown in FIG. 21, light guide layer 78 may have tabs 78T. Each tab 78T may protrude from an edge of the light guide layer. Tabs 78T may therefore sometimes be referred to as protrusions 78T. Protrusions 78T may be used to secure the light guide layer within the electronic device. For example, adhesive may be attached to an upper or lower surface of the protrusions.

In some cases, tabs 78T may cause visible artifacts when viewing the display. For example, at a high viewing angle the areas of light guide layer 78 adjacent to tabs 78T in the active area may appear darker than other areas. To avoid this type of visible artifact, an additional layer may be included on the tabs to reduce the differences between the areas adjacent to the tabs and the areas not adjacent to the tabs.

Figure 22:
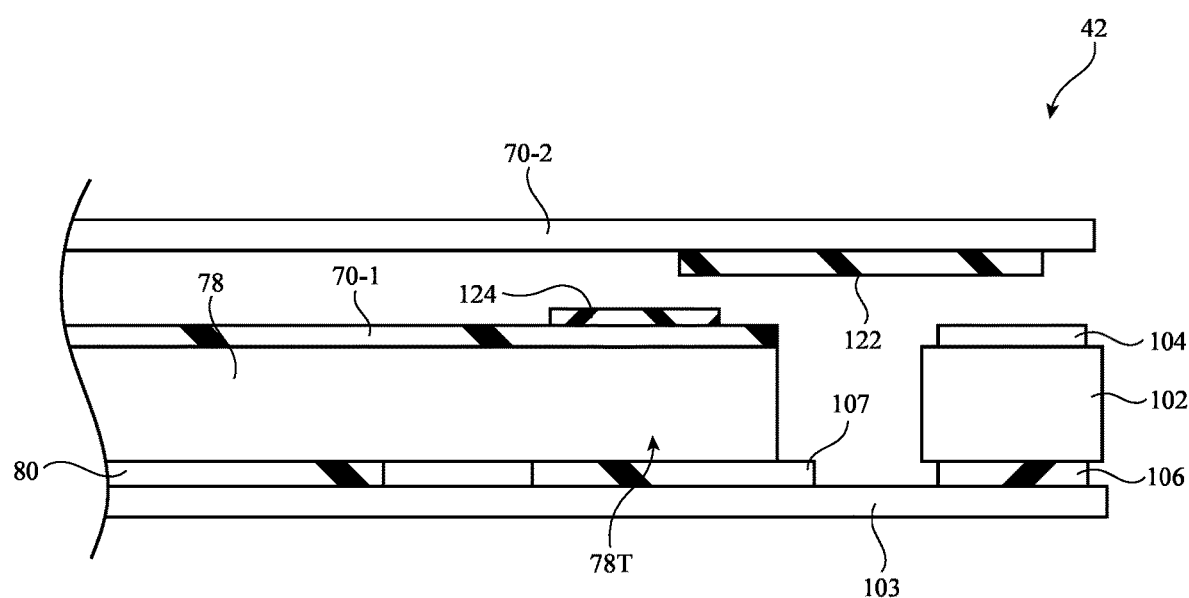
FIG. 22 is a cross-sectional side view of an illustrative light guide layer having tabs and a color and/or luminance correcting layer mounted over the tab in accordance with an embodiment.

FIG. 22 is a cross-sectional side view of backlight structures 42 showing a tab 78T of light guide layer 78. As shown, adhesive layer 107 may attach the tab to chassis 103. FIG. 22 shows an additional optical film 70-2 positioned above optical film 70-1. Optical film 70-2 may be, for example, a diffuser layer, a brightness enhancement film, or any other desired type of optical film. An opaque masking layer 122 may be formed on the lower surface of optical film 70-2. Opaque masking layer 122 may be formed from black ink or another desired opaque material. The presence of the opaque masking layer may contribute to the contrast difference in regions of the light guide layer adjacent to the tabs 78T.

Additional ink layer 124 may be included over tab 78T to correct contrast differences in the tab region. The additional ink layer 124 (sometimes referred to as coating 124, layer 124, tape layer 124, color correcting layer 124, compensating layer 124, luminance correcting layer 124, or paint layer 124) may have a color selected to correct contrast differences in the tab regions. The ink layer 124 may be black, gray, or any other desired color. Layer 124 may be formed only over the tab 78T of light guide layer 78 or may be partially formed over non-tab portions of light guide layer 78. The layer may overlap some of the active area of the display or may not overlap the active area of the display. In FIG. 22, layer 124 is depicted as being formed on turning film 70-1 (e.g., layer 124 directly contacts the upper surface of turning film 70-1). This example is merely illustrative. If desired, the layer 124 may be formed in direct contact with the light guide layer 78 (e.g., an upper surface of a tab 78T of the light guide layer). The layer 124 may be interposed between light guide layer 78 and turning film 70-1. Similarly, opaque masking layer 122 may be formed at any desired location within the display (e.g., on an upper or lower surface of an additional optical film, between and in direct contact with two adjacent optical films, etc.). Layers 122 and 124 may be formed from ink, pigment, or any other material that creates a difference in color or luminance compared with the surrounding material.

In some cases, a compensating layer may be used to modify the backlight provided to display layers 46 to compensate for variations in display layers 46. For example, consider an example where display layers 46 receive homogenous backlight with a uniform color and luminance and the display layers are configured to display a uniform white color on the active area of the display. Because the backlight has a uniform color and luminance, the display layers would ideally emit a uniform white light. However, even if receiving backlight with a uniform color and luminance, variations in the display layers may cause the emitted light to have a non-uniform appearance.

Figure 23:
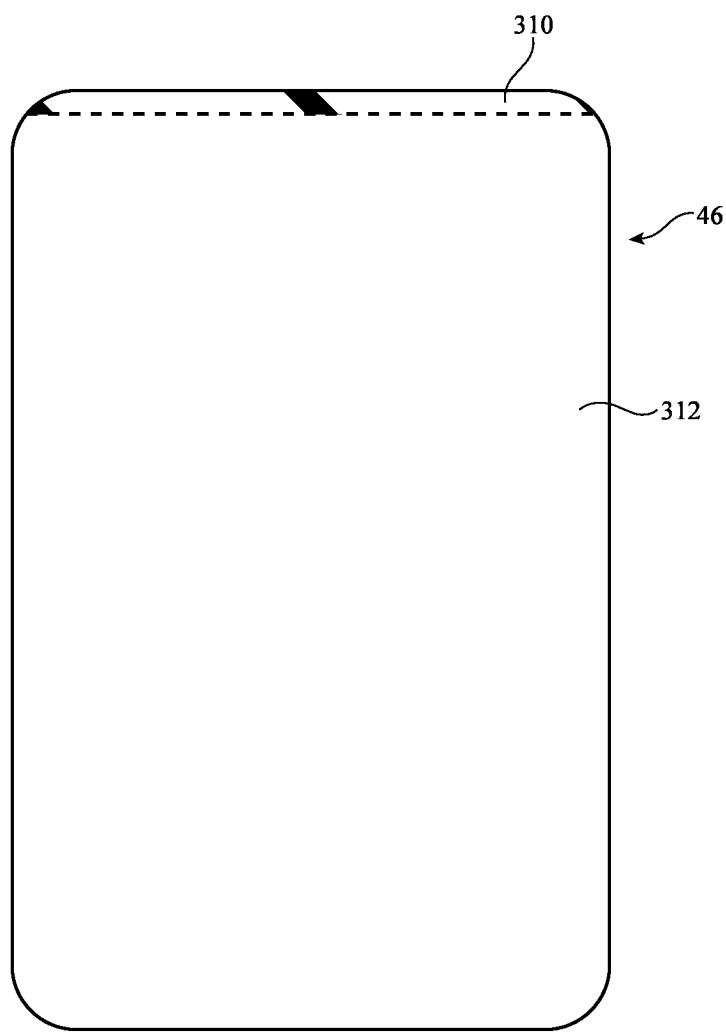
FIG. 23 is a top view of illustrative display layers showing how the display layers may have a non-uniformity such as a bright band along the upper edge when in accordance with an embodiment.

FIG. 23 is a top view of display layers 46 attempting to display a uniform white color (when receiving uniform backlight). Despite receiving uniform backlight, the display layers may have a band 310 along an upper edge of the display that is brighter than the remaining portion 312 of the display. The bright band 310 may be caused by variations within the display layers (e.g., thickness variations at the edge of the display layers). To correct for these types of a variations within the display layers, non-uniform backlight may deliberately be provided to the display layers. For example, the backlight provided to display layers 46 in region 310 may be dimmer than the backlight provided to display layers in region 312.

Figure 24:
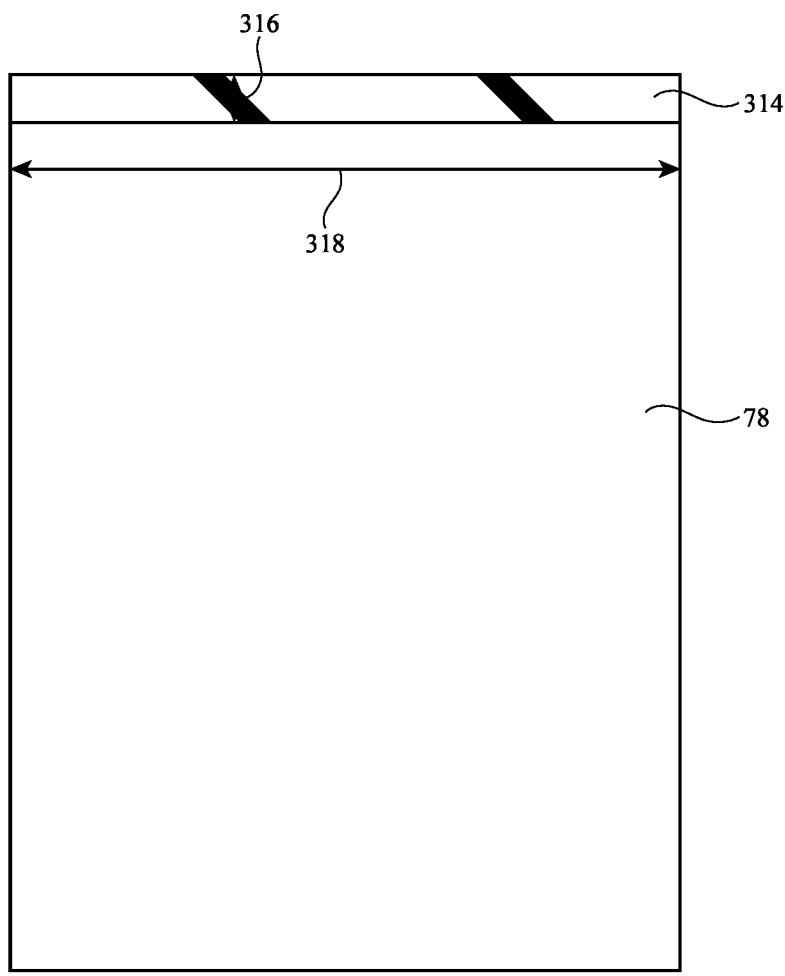
FIGS. 24 and 25 are top views of illustrative backlight structures showing how ink may be patterned above the light guide layer to compensate for a non-uniformity of the display in accordance with an embodiment.

To dim the backlight provided to the display layers in region 310, a compensating layer may be included between the light guide layer 78 and the display layers. FIG. 24 is a top view of a light guide layer showing how compensating layer 314 may cover a portion of the light guide layer. The compensating layer 314 may have a length 318 and width 316. Because the non-uniformity of the display layers (in this example) is along the upper edge of the display, the compensating layer is also formed along the upper edge of the display layer.

Compensating layer 314 (sometimes referred to as coating 314, layer 314, tape layer 314, color correcting layer 314, compensating layer 314, luminance correcting layer 314, or paint layer 314) may have a color selected to correct for non-uniformities in the display layers. Compensating layer 314 may be formed from ink, pigment, or any other material that creates a difference in color or luminance compared with the surrounding material. The compensating material may be formed at any desired position between the light guide layer and the display layers (e.g., on the light guide layer, on an optical film, etc.). The compensating layer may be formed from gray ink or blank ink, in one example. The density of the ink may vary within the compensating layer if desired (e.g., the ink may have a higher density closer to the edge of the light guide layer).

Figure 25:
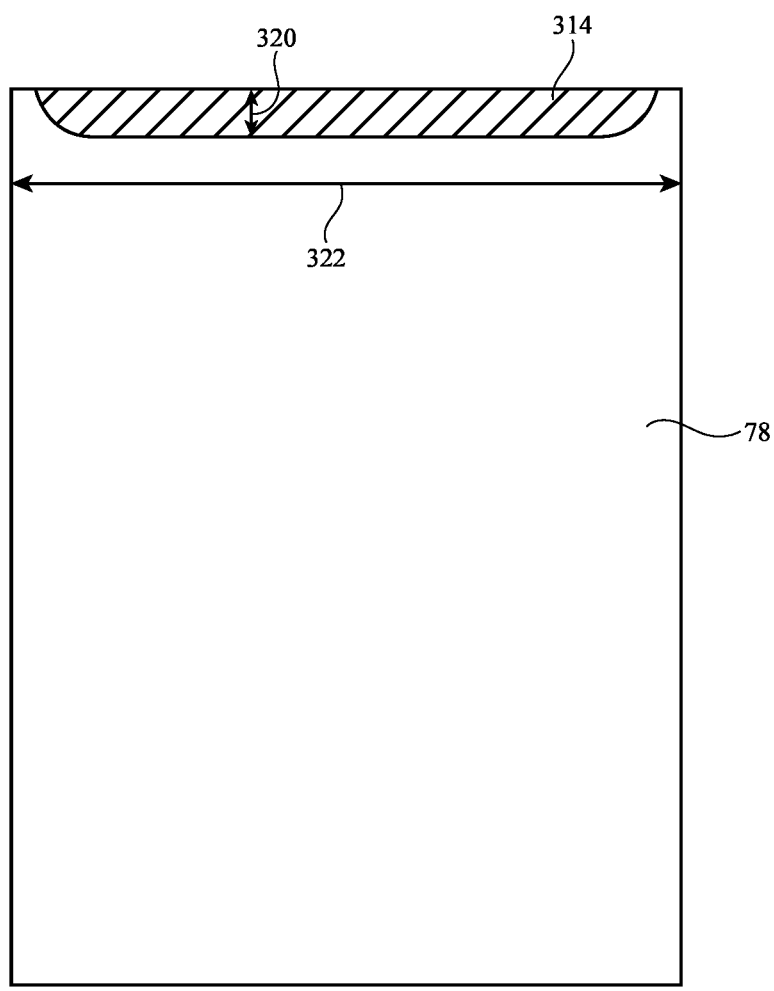

The shape of the region covered with compensating layer 314 in FIG. 24 is merely illustrative. Compensating layer 314 may have any desired shape. FIG. 25 shows an example where compensating layer 314 covers a smaller area of light guide layer 78 than in FIG. 24. In FIG. 25, compensating layer 314 has a length 322 that is less than the length 318 of FIG. 24. Similarly, compensating layer 314 has a width 320 that is less than the width 316 of FIG. 24. Compensating layer 314 may have curved edges and may extend only partially across the upper edge of the light guide layer, as shown in FIG. 25.

The example in FIGS. 24 and 25 of compensating layer 314 covering the upper edge of the light guide layer is merely illustrative. In this example, the light-emitting diodes that provide light to the light guide layer are positioned along the left edge of the display and the compensating layer 314 is positioned along the upper edge of the display. However, compensating layer 314 may be positioned along the left edge of the display or any other desired location of the display. More than one compensation layer (optionally having different colors or other properties) may also be used to correct for variations within the display layers.

Figure 26:
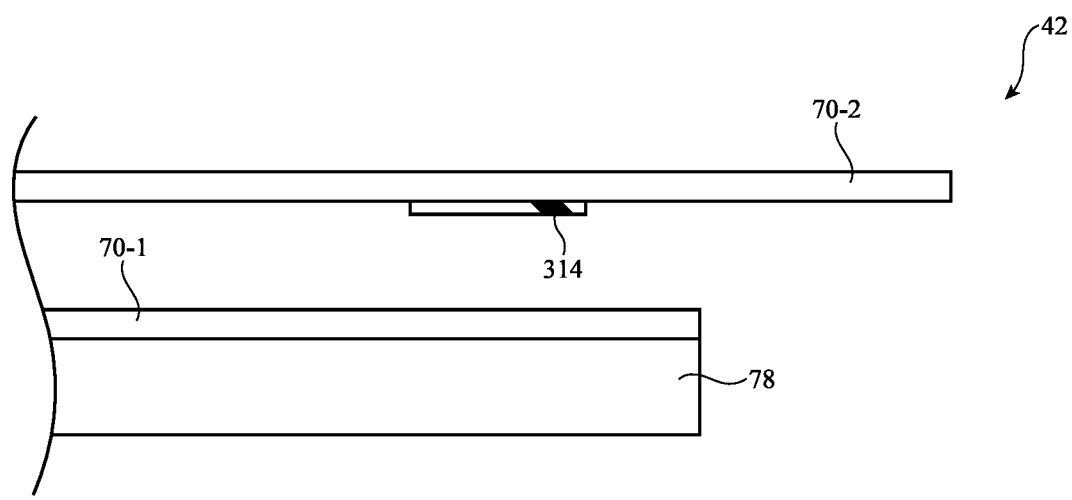
FIG. 26 is a cross-sectional side view of illustrative backlight structures showing how ink may be patterned above the light guide layer to compensate for a non-uniformity of the display in accordance with an embodiment.

FIG. 26 is a cross-sectional side view backlight structures that include a compensating layer to correct for variations in display layers 46. As shown in FIG. 26, compensation layer 314 may also be formed on the lower surface of an additional optical film 70-2 (e.g., a diffuser layer, brightness enhancement film, etc.). Compensation layer 314 may instead be formed on turning film 70-1 if desired. Compensation layer 314 may be formed at any other desired location within the display (e.g., directly on the upper surface of light guide layer 78, on the upper surface of an additional optical film, etc.).

Figure 27:
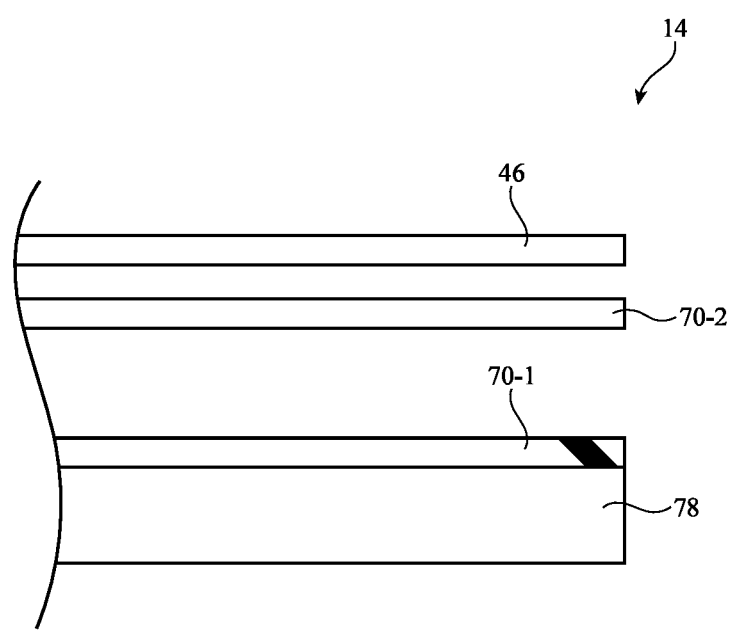
FIG. 27 is a cross-sectional side view of illustrative backlight structures that include an additional optical film between a turning film and display layers in accordance with an embodiment.

As shown in the cross-sectional side view of FIG. 27, an additional optical film 70-2 may be incorporated between turning film 70-1 and display layers 46. Optical film 70-2 may be a diffuser layer, a brightness enhancement film, a compensation film for enhancing off-axis viewing, a polarizer layer, a combination of one or more of these etc. FIG. 28 is a cross-sectional side view of optical film 70-2. As shown in FIG. 28, optical film 70-2 may be formed from a plurality of layers (e.g., layer 324-1, layer 324-2, layer 324-3, layer 324-4, and layer 324-5). These layers may include pressure sensitive adhesive (PSA) layers, polarizing layers, and/or any other desired type of layer. To improve the defect hiding power of the optical film, the optical film may include a diffusive pressure sensitive adhesive layer. FIG. 29 is a cross-sectional side view of optical film 70-2 that includes diffusive pressure sensitive adhesive layer 324-6. In this example, optical film 70-2 may be a brightness enhancement film. Including the diffusive pressure sensitive adhesive layer in the brightness enhancement film may cause additional diffusion of light received from the light guide layer. This may hide particle defects in the underlying layers (e.g., defects caused by contaminant particles or other kinds of defects).

The example of diffusive pressure sensitive adhesive layer 324-6 being interposed between other layers in brightness enhancement film 70-2 is merely illustrative. Diffusive pressure sensitive adhesive layer 324-6 may instead be the upper-most layer in brightness enhancement film 70-2 or the lowest layer in brightness enhancement film 70-2. In some embodiments, diffusive pressure sensitive adhesive layer 324-6 may be attached to and in direct contact with an additional pressure sensitive adhesive layer (e.g., a pressure sensitive adhesive layer that does not have diffusive properties). For example, layer 324-2 in FIG. 29 may be a pressure sensitive adhesive layer (that does not have diffusive properties) or layer 324-3 in FIG. 29 may be a pressure sensitive adhesive layer (that does not have diffusive properties).

During manufacturing, some electronic devices may be produced with defects that affect the quality of the display. The defects may result in artifacts that are visible if corrective action is not taken. Without corrective action, some of the manufactured electronic devices may not be suitable for use. To increase the number of manufactured devices that may be used, display compensation techniques may be applied to the electronic devices.

Figure 30:
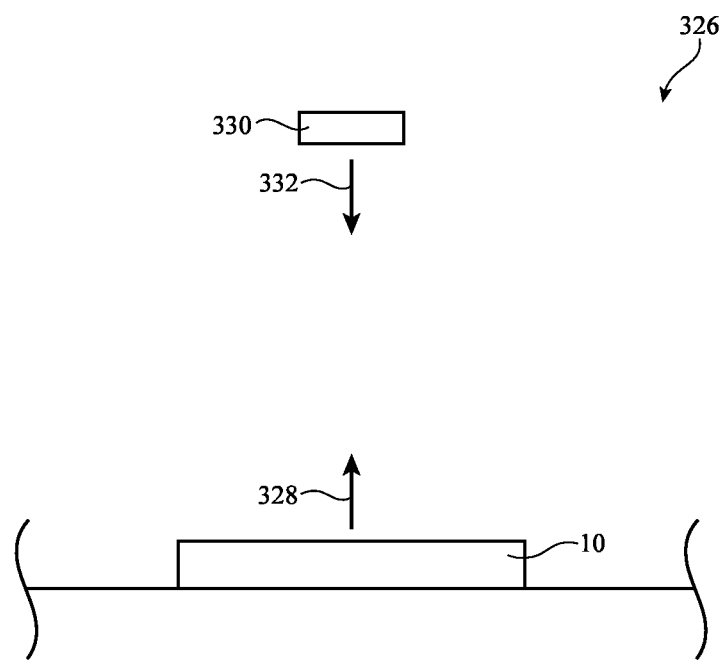
FIG. 30 is a diagram of an illustrative system used to capture images of the display of an electronic device for compensation in accordance with an embodiment.

FIG. 30 shows an illustrative system 326 for capturing images of a display and determining if compensation is required. As shown in FIG. 30, an electronic device being tested (sometimes referred to as a device under test) may emit light in direction 328 using display 14. The device under test (DUT) may attempt to emit a uniform white image or some other desired test image. An image sensor 330 facing direction 332 may face the display of the DUT. The image sensor may capture an image of the display to determine if any irregularities are present in the display. The detected irregularities may be used to generate a pixel compensation table that is used to correct for the irregularities during operation of the device. For example, image sensor 330 may detect that, when attempting to display an entirely white image, a portion of the display of the DUT is slightly blue. The pixels in the slightly blue region of the display may therefore be configured to show a slightly yellow image. The yellow tint of the display pixels compensates for the blue tendency of the display, resulting in a uniform white image across the display.

Figure 31:
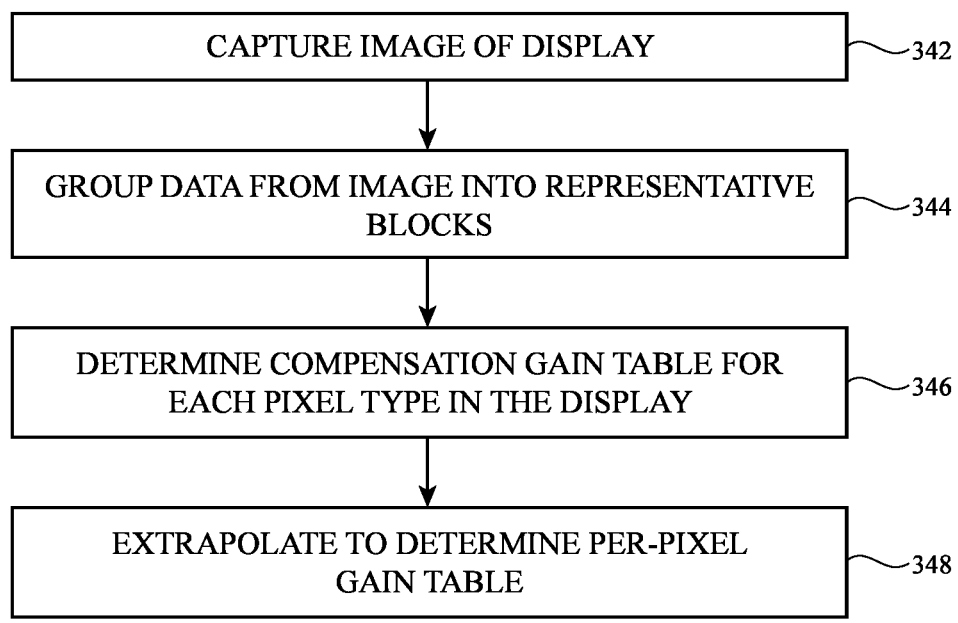
FIG. 31 is a diagram of illustrative method steps used to determine compensation values for each pixel in a display in accordance with an embodiment.

FIG. 31 is a diagram of illustrative method steps that may be used to generate compensation information for a display in an electronic device. At step 342, an image of the display in an electronic device may be captured (e.g., using image sensor 330 in FIG. 30) while the display displays a known image (e.g., all white). Next, at step 344, the image data may be grouped into representative blocks. For example, the image sensor that captures the image in step 342 may have a given number of rows and columns pixels. Each pixel may have a corresponding image signal. At step 344, the image signals from more than one imaging pixel may be grouped (e.g., summed, averaged, or grouped using some other technique) into a single value that represents a block of pixels within the display.

Next, at step 346, a compensation gain table may be determined for each type of pixel in the display. For example, if the representative value determined in step 344 indicates that the display has a bluish tint when attempting to display white, compensation values for each pixel type (e.g., red pixels, blue pixels, and green pixels) may be determined that result in the display emitting a desired white color when attempting to display white. At step 346, the compensation gain table may have a corresponding compensation gain table for each color of pixel in the display (e.g., gain tables for the red, blue, and green pixels for a total of three gain tables). Each compensation gain table may have a compensation value for each block of pixels grouped in step 344.

Finally, at step 348, the compensation gain tables of step 346 may be extrapolated to determine a per-pixel compensation gain table for each color of pixel in the display. During operation of the display, each pixel may have its pixel value modified by the gain value from the per-pixel compensation gain table before the pixel displays the pixel value.

Figure 32:
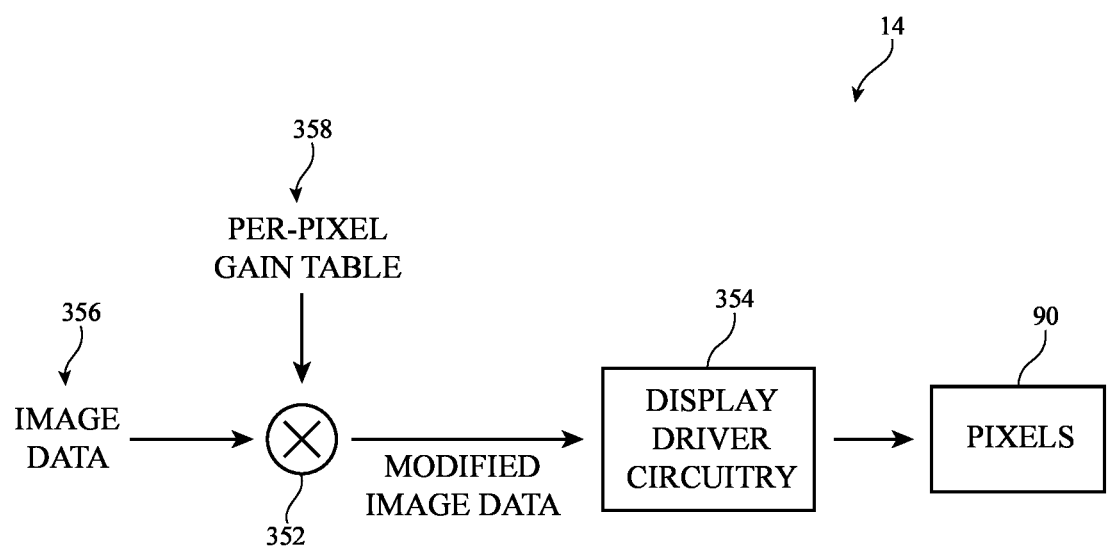
FIG. 32 is a diagram of an illustrative display showing how the compensation values for each pixel may be used to modify image data before the image data is provided to display driver circuitry in accordance with an embodiment.

FIG. 32 shows a schematic diagram of illustrative circuitry that may be used in implementing display 14 of device 10. During operation of electronic device 10, control circuitry in the device may supply image data 356 for images to be displayed on display 14. Ultimately, the image data may be delivered to display driver circuitry 354, which may supply the image data to data lines of the display. Display driver circuitry 354 may also include gate driver circuitry which is used to assert gate line signals on gate lines of display 14. The display driver circuitry may be used to provide the image data to pixels 90 in the display.

Before being provided to display driver circuitry 354, the image data may be multiplied by compensation factors from gain table 358 in multiplication circuit 352 (sometimes referred to herein as a gain circuit or modification circuit). Each frame of image data 356 may include a representative brightness value for each pixel 90. Gain table 358 may include a compensation factor for each pixel 90. The compensation factor may correct for display uniformity issues (as determined using the method of FIG. 31, for example). For example, if while performing the method of FIG. 31 it is determined that the display has a bluish tint when attempting to display white, the brightness of a blue pixel in this region may be reduced to ensure a white color is displayed when desired.

After image data 356 is multiplied by the dimming factors from gain table 358, the modified image data may be provided to display driver circuitry 354. Display driver circuitry 354 will then provide the modified image data to the pixels in the display. The pixels may then display the desired image.

Multiplication circuit 352, gain table 358, display driver circuitry 354, and pixels 90 as shown in FIG. 32 may sometimes be collectively referred to as display circuitry. Alternatively, pixels 90 may sometimes be referred to as a display while multiplication circuit 352, gain table 358, and display driver circuitry 354 may sometimes collectively be referred to as control circuitry. The example of a multiplication circuit 352 that multiplies image data 356 by compensation factors from per-pixel gain table 358 is merely illustrative. Other desired types of modifications (in addition or instead of multiplication) may be used to modify image data 356 based on compensation factors 358. For example, the per-pixel gain table may include compensation factors that are added to the image data to produce the modified image data. Circuit 352 may therefore sometimes be referred to as an image data modification circuit.

Figure 33:
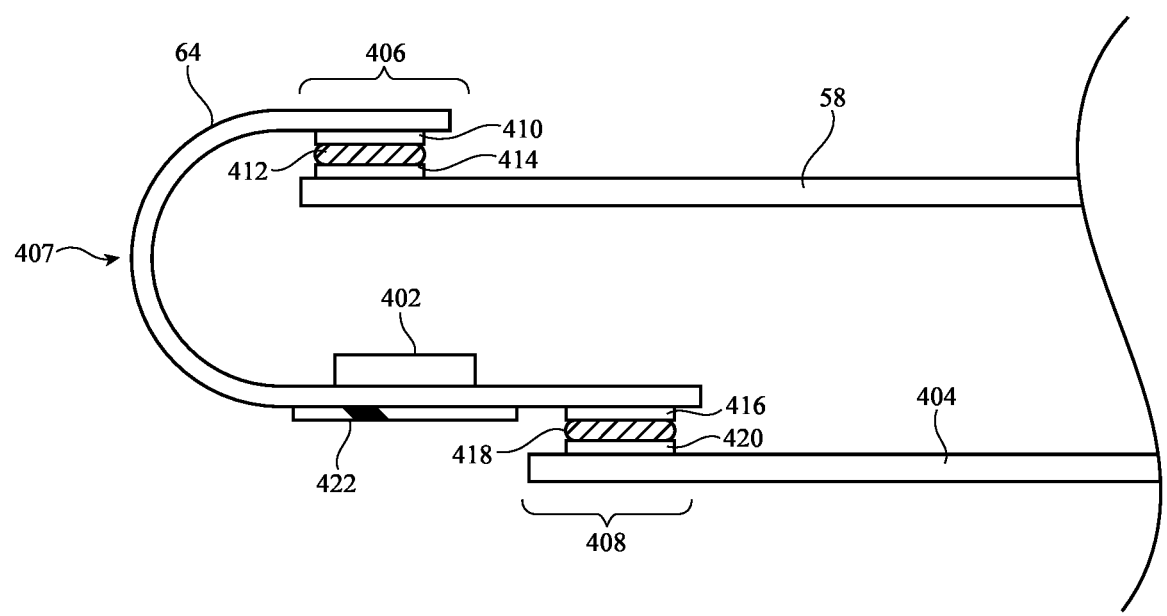
FIG. 33 is a cross-sectional side view of an illustrative display with a flexible printed circuit that attaches a thin-film transistor layer to a rigid printed circuit board in accordance with an embodiment.

In FIG. 3, it was discussed how information to be displayed on display 14 may be conveyed to a display driver integrated circuit using a signal path such as a signal path formed from conductive metal traces in a rigid or flexible printed circuit such as printed circuit 64 (as an example). FIG. 33 is a cross-sectional side view of a flexible printed circuit (64) that is used to convey signals from a rigid printed circuit board to a display driver integrated circuit 402 and from the display driver integrated circuit 402 to thin-film transistor layer 58. The display driver integrated circuit may be mounted directly to flexible printed circuit 64. This may be referred to as a chip-on-flex (COF) arrangement. The flexible printed circuit may be coupled between thin-film transistor layer 58 and printed circuit board 404. Printed circuit board 404 may be, for example, a rigid printed circuit board (sometimes referred to as a motherboard).

In region 406, flexible printed circuit 64 is coupled to thin-film transistor (TFT) layer 58. In region 408, flexible printed circuit 64 is coupled to rigid printed circuit board 404. In region 406, a conductive layer 412 may couple a contact 410 of the flexible printed circuit to a contact 414 of the thin-film transistor layer. Contacts 410 and 414 may be contact pads, traces, or any other desired conductive layer. Conductive layer 412 may be anisotropic conductive film (ACF), may be solder, or may be formed from any other desired conductive material. In region 408, a conductive layer 418 may couple a contact 416 of the flexible printed circuit to a contact 420 of the rigid printed circuit board. Contacts 416 and 420 may be contact pads, traces, or any other desired conductive layer. Conductive layer 418 may be anisotropic conductive film (ACF), may be solder, or may be formed from any other desired conductive material. Flexible printed circuit 64 may have a bent region 407 interposed between regions 406 and 408.

To add structural support for display driver integrated circuit 402, a stiffener 422 may be included on flexible printed circuit 64. Stiffener 422 may be formed on an opposing side of flexible printed circuit 64 as display driver integrated circuit 402. The presence of stiffener 422 protects integrated circuit 402 from vibrations or drop events that may otherwise damage the integrated circuit. Stiffener 422 may be formed from stainless steel or another desired material. Stainless steel may be stiff enough to provide sufficient structural support for the integrated circuit 402.

Figure 34:
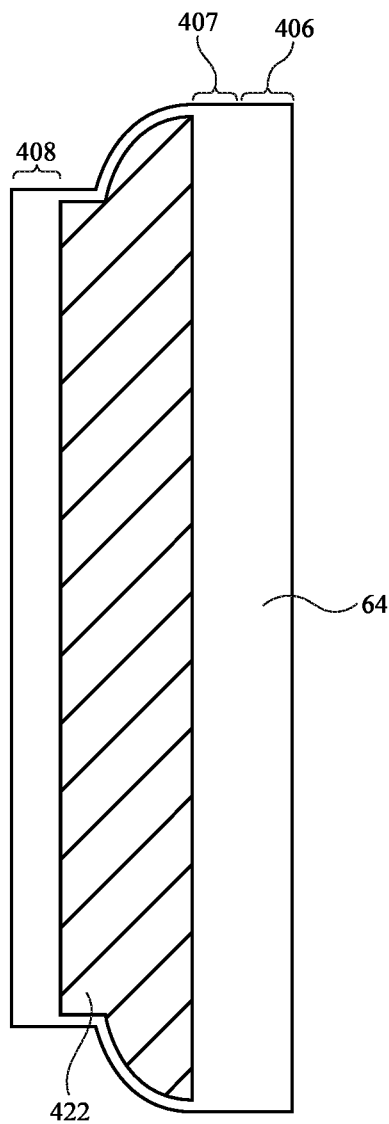
FIG. 34 is a top view of an illustrative flexible printed circuit that attaches a thin-film transistor layer to a rigid printed circuit board and that has a stiffener in accordance with an embodiment.

FIG. 34 is a top view of flexible printed circuit 64 in an unbent state. As shown, stainless steel stiffener 422 may extend along the length of the flexible printed circuit. The stiffener has a first portion (on the side of attachment region 408) with a first length and a second portion (on the side of bending region 407) with a second length that is different than the first length. The total length of the stiffener may be more than three times greater than its width, more than five times greater than its width, more than seven times greater than its width, less than twelve times greater than its width, etc. This example is merely illustrative. In general, stiffener 422 may have any desired shape. The flexible printed circuit may extend along an edge of the thin-film transistor layer. In one example, the flexible printed circuit may extend along the same edge of the thin-film transistor layer that overlaps the light-emitting diodes of the backlight structures (e.g., the flexible printed circuit may extend along the left edge of the thin-film transistor layer). This example is merely illustrative, and the flexible printed circuit (and stiffener) may extend along any desired edge of the thin-film transistor layer.

Figure 35:
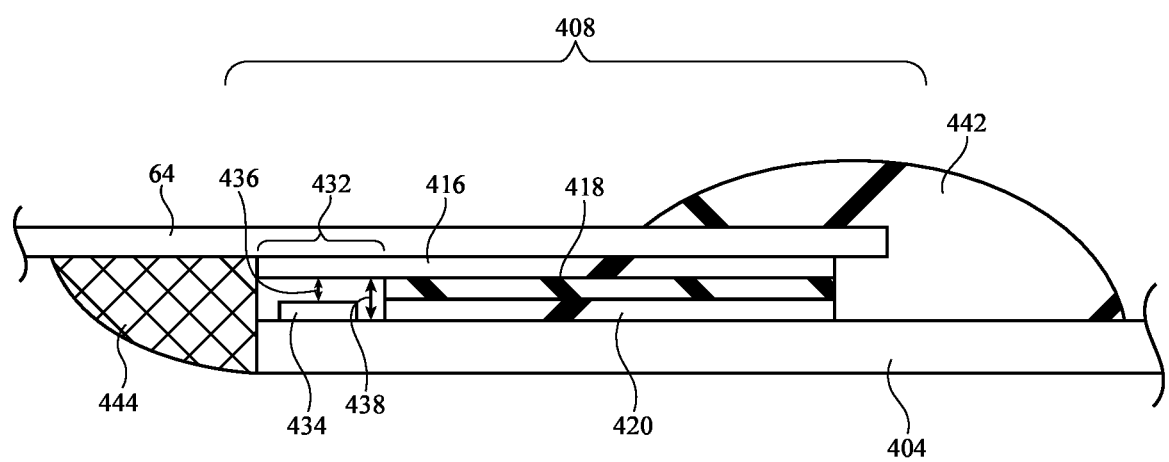
FIG. 35 is a cross-sectional side view of an illustrative attachment region between a flexible printed circuit and a rigid printed circuit board in accordance with an embodiment.

FIG. 35 is a cross-sectional side view of attachment region 408 of the flexible printed circuit showing how flexible printed circuit 64 is attached to rigid printed circuit board 404. FIG. 35 shows how printed circuit board 404 includes a conductive layer 420 that is coupled to anisotropic conductive film 418. The anisotropic conductive film is also coupled to trace 416 of flexible printed circuit 64.

As shown in FIG. 35, a portion 432 of trace 416 may not directly contact anisotropic conductive film 418. Portion 432 of trace 416 is therefore separated from the upper surface of rigid printed circuit board 404. To improve reliability of the trace, a solder mask layer 434 may be included between portion 432 of trace 416 and rigid printed circuit board 404. Without solder mask layer 434 present, a gap 438 may be present between trace 416 and the upper surface of rigid printed circuit board 404. With this large gap, traces 416 may dent or crack after bonding (due to compression on portion 432 during the bonding process and portion 432 bending towards rigid printed circuit board 404). To prevent these issues, solder mask layer 434 may be included below portion 432 of trace 416. With the presence of solder mask layer 434, the gap 436 below portion 432 of trace 416 is much smaller (e.g., than gap 438). Reducing the size of the gap below portion 432 of trace 416 improves reliability of the trace by preventing portion 432 from bending and cracking.

Gap 436 may be less than 1 millimeter, less than 0.1 millimeters, less than 0.01 millimeters, less than 0.001 millimeters, etc. In some cases, the gap may be removed entirely (and portion 432 of trace 416 directly contacts solder mask layer 434). The example of including solder mask layer 434 below portion 432 of trace 416 is merely illustrative. In general, any desired type of material may be incorporated below portion 432 of trace 416 to prevent damage to the trace. Solder mask layer 434 may therefore instead sometimes be referred to as a layer, dielectric layer, gap-filling layer, filler, etc. Using the solder mask material as the gap-filling layer may be advantageous for manufacturing as the solder mask material may already be deposited on the rigid printed circuit board during the manufacturing process. Therefore, no additional manufacturing steps are required to use the solder mask material as gap-filling layer 434.

When flexible printed circuit 64 is bonded to rigid printed circuit board 404 in region 408, excess material that forms anisotropic conductive film (ACF) 418 may flow over the edge of the printed circuit board. This process may be referred to as squeeze-out, for example. If gap-filling layer 434 extended as a strip across the entire printed circuit board 404, the paths for the excess ACF material may be blocked. This may result in poor anisotropic conductive film compression (and a poor electrical connection between the flexible printed circuit and rigid printed circuit board).

Figure 36:
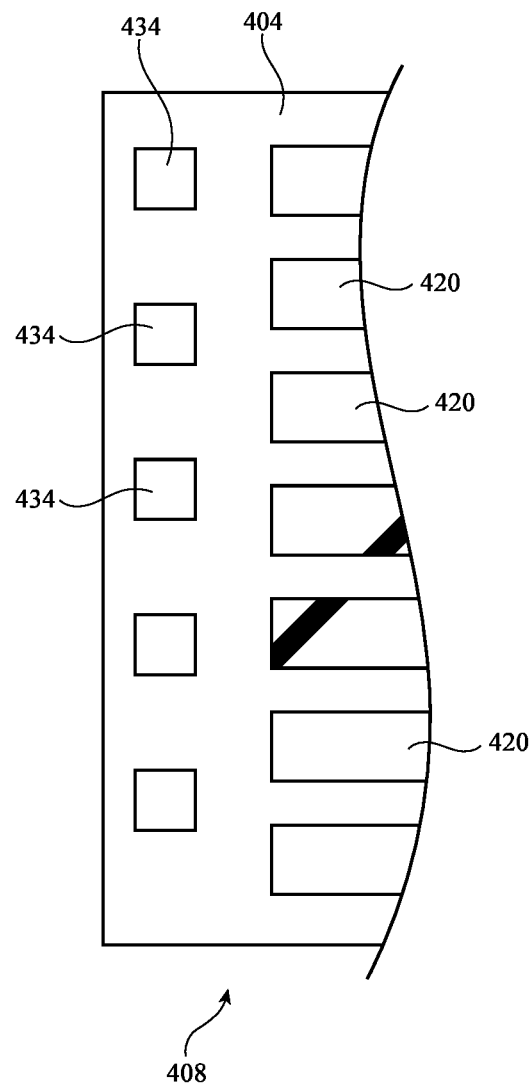
FIG. 36 is a top view of an illustrative attachment region between a flexible printed circuit and a rigid printed circuit board showing island-shaped gap-filling layers in accordance with an embodiment.

To fill the gap between trace 416 and rigid printed circuit board 404 while still providing channels for excess ACF material to flow during compression, a number of discrete gap-filling layers 434 may be formed along the edge of the rigid printed circuit board. FIG. 36 is a top view of the rigid printed circuit board showing a number of discrete gap-filling layers 434 along the edge of rigid printed circuit board 404. Each gap-filling layer 434 may be completely laterally surrounded by portions of rigid printed circuit board 404 that are not attached to the gap-filling layer. The discrete gap-filling layers 434 may be referred to as island-type or island-shaped gap-filling layers.

Returning to FIG. 35, encapsulant such as encapsulant 442 and 444 may be incorporated in attachment region 408. The encapsulant may provide strain relief to improve reliability and robustness of the attachment between flexible printed circuit 64 and rigid printed circuit board 404.

Encapsulant 444 is attached to a lower surface of flexible printed circuit 64 and an edge surface of rigid printed circuit board 404. Encapsulant 444 may protect exposed metal traces on flexible printed circuit 64 from touching the edge of printed circuit board 404. Encapsulant 444 may also absorb heat generated by the electronic device. Encapsulant 444 may also prevent moisture or other contaminants from reaching the conductive components that form the attachment between flexible printed circuit 64 and rigid printed circuit board 404. Encapsulant 444 may conform to the edge of printed circuit board 404 if desired.

Encapsulant 442 is attached to an upper surface of flexible printed circuit 64, an edge surface of flexible printed circuit 64, and an upper surface of rigid printed circuit board 404. Encapsulant 442 may also absorb heat generated by the electronic device. Encapsulant 442 may also prevent moisture or other contaminants from reaching the conductive components that form the attachment between flexible printed circuit 64 and rigid printed circuit board 404. Encapsulant 442 may be formed from a conformal material that conforms to the edge of the flexible printed circuit the edge of anisotropic conductive film 418, and the edges of traces 416 and 420. Encapsulant 442 and 444 may be formed from the same material or different materials. The encapsulation may be formed from an elastic material (e.g., a material with a low Young's modulus).

Figure 37:
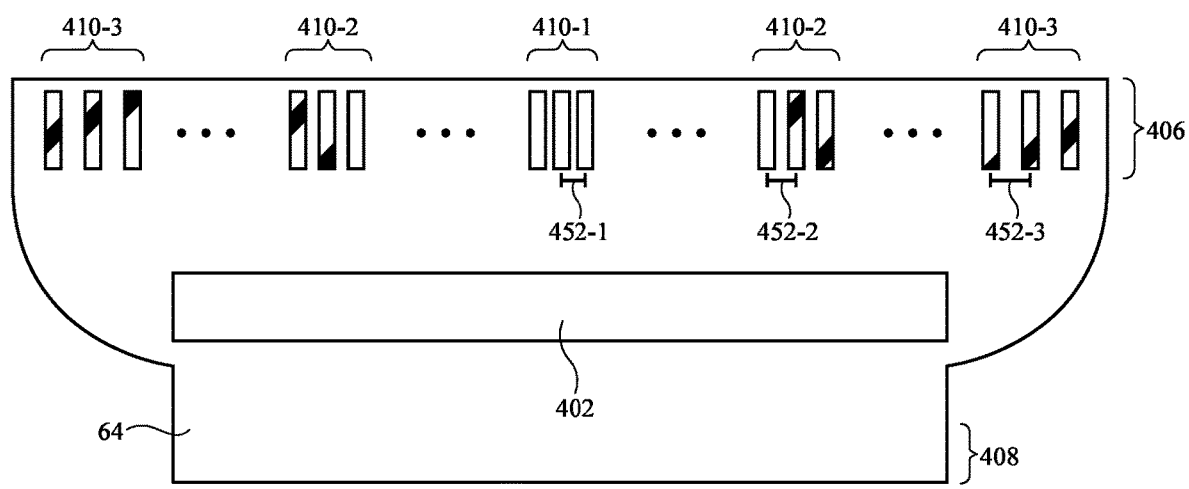
FIG. 37 is a top view of an illustrative flexible printed circuit having traces with a pitch that varies across the flexible printed circuit in accordance with an embodiment.

FIG. 37 is a top view of flexible printed circuit 64 in an unbent state showing how the pitch of traces 410 may vary across the flexible printed circuit. As shown, traces 410 may be distributed across the flexible printed circuit in attachment region 406 (e.g., that attaches the flexible printed circuit to thin-film transistor layer 58). In general, it is desirable to position the traces close together (as this may allow more traces to be included on the flexible printed circuit in the same amount of area). However, the traces must be separated by a sufficient distance to ensure that the traces do not touch (thus shorting the traces and preventing them from functioning correctly).

Based on the manufacturing methods in producing flexible printed circuit 64, the tolerance in producing the traces may vary dependent upon the position of the trace within the flexible printed circuit. For example, the position of traces in the center of the flexible printed circuit may be more controllable (e.g., have a lower tolerance) than the traces at the edges of the flexible printed circuit. Therefore, the pitch of the traces may vary across the flexible printed circuit to match the manufacturing tolerance.

As shown in FIG. 37, traces 410-1 in the center of the flexible printed circuit may have a corresponding pitch 452-1. Because manufacturing tolerance is smallest in the center of the flexible printed circuit (and therefore the position of the traces is best controlled in the center of the flexible printed circuit), pitch 452-1 may be small. Traces 410-2 are closer to the edge of the flexible printed circuit than traces 410-1. The manufacturing tolerance for traces 410-2 may be larger than the manufacturing tolerance for traces 410-1. Therefore, the position of traces 410-2 cannot be controlled as well as the position of traces 410-1. Accordingly, pitch 452-2 is greater than pitch 452-1. Manufacturing tolerance may be at a maximum at the edges of the flexible printed circuit (and therefore the position of the traces is worst controlled in the edges of the flexible printed circuit). Therefore, pitch 452-3 may be larger than pitches 452-2 and 452-1.

Figure 38:
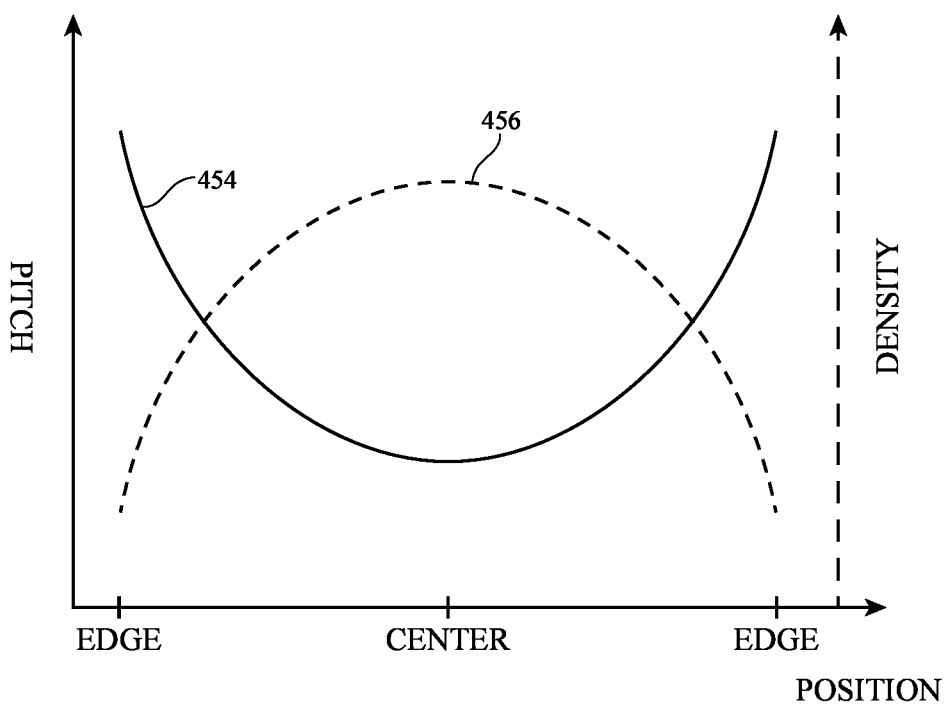
FIG. 38 is a graph showing illustrative profiles of the pitch and density of the flexible printed circuit traces as a function of position in accordance with an embodiment.

FIG. 38 is a graph showing pitch and density of traces 410 as a function of position along the flexible printed circuit. As shown, the traces may have a pitch that follows an illustrative profile 454. At the edges of the flexible printed circuit, the pitch is at its highest levels. At the center of the flexible printed circuit, the pitch is at its minimum level. The traces may have a uniform width. Therefore, the density of the traces is inversely proportional to the pitch of the traces. Profile 456 shows an illustrative profile for the density of the traces. At the edges of the flexible printed circuit, the density is at its lowest levels. At the center of the flexible printed circuit, the density is at its highest level. The illustrative profiles shown in FIG. 38 are merely illustrative. The profiles may have sloped portions (as in FIG. 38) or may follow a step-function that follows a similar shape as profiles 454 and 456.

Figure 39:
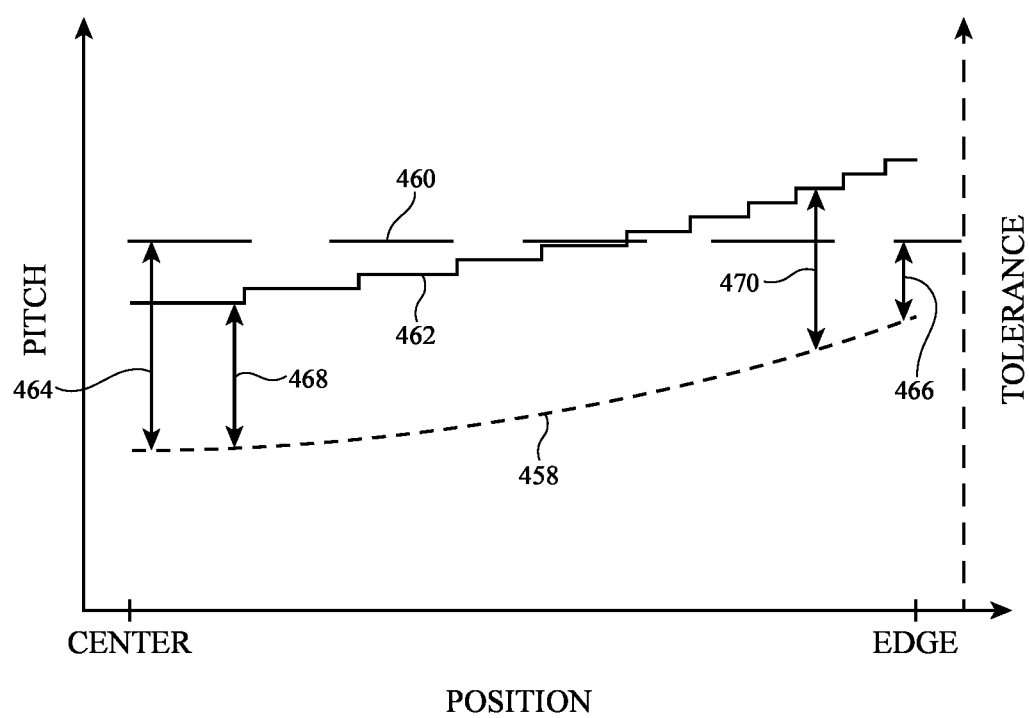
FIG. 39 is a graph showing illustrative tolerance and pitch profiles of the flexible printed circuit traces as a function of position in accordance with an embodiment.

The pitch and density profiles may have a similar shape as a profile of the manufacturing tolerance of the traces. FIG. 39 is a graph showing the pitch profile of the traces relative to the tolerance profile for the traces. Profile 458 shows the tolerance of the traces as a function of position within the flexible printed circuit. As shown, the tolerance increases as the traces get further from the center of the flexible printed circuit and closer to the edges of the flexible printed circuit.

Profile 460 shows a profile for traces having a constant pitch across the flexible printed circuit. As shown, when the pitch of the traces does not change, margin 464 between the pitch and the tolerances at the center of the flexible printed circuit may be larger than margin 466 between the pitch and the tolerances at the edges of the flexible printed circuit. At the center of the flexible printed circuit, margin 464 may be too large (meaning that a lower-than-necessary number of traces are fit at the center of the flexible printed circuit). At the edges of the flexible printed circuit, margin 466 may be small (meaning that the traces may be susceptible to being shorted together).

To avoid these issues and have a consistent margin across the flexible printed circuit, the pitch may instead vary across the flexible printed circuit as shown by profile 462. In profile 462, the pitch increases stepwise from a minimum at the center of the flexible printed circuit to a maximum at the edge of the flexible printed circuit. This allows the pitch to follow the same profile as tolerance profile 458 and ensures that the margin remains consistent regardless of position (e.g., margin 468 close to the center is the same as margin 470 close to the edge).

The examples of profile shapes in FIGS. 38 and 39 are merely illustrative. In general, the pitch of the traces may follow any desired profile. For example, the pitch profiles may be asymmetrical (instead of symmetrical as in FIG. 38). If manufacturing tolerance was instead highest in the center of the flexible printed circuit, the pitch may be highest in the center of the flexible printed circuit as well. The pitch of the traces at any given position may be based on the manufacturing tolerance for the traces at that position.

Figure 40:
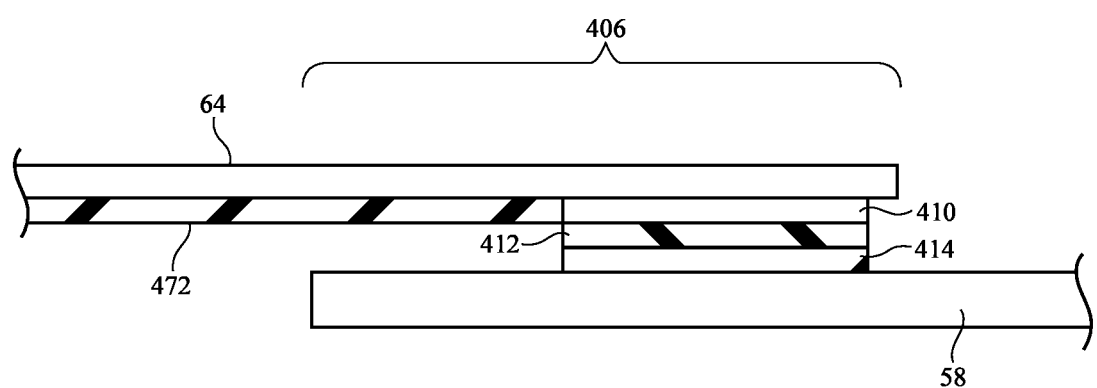
FIG. 40 is a cross-sectional side view of an illustrative attachment region between a flexible printed circuit and a thin-film transistor layer in accordance with an embodiment.

FIG. 40 is a cross-sectional side view of flexible printed circuit 64 and thin-film transistor layer 58 in attachment region 406. FIG. 40 shows how thin-film transistor layer 58 includes a conductive layer 414 that is coupled to anisotropic conductive film 412. The anisotropic conductive film is also coupled to trace 410 of flexible printed circuit 64. To prevent damage to traces on flexible printed circuit layer 64 (e.g., caused by flexible printed circuit 64 contacting the edge of thin-film transistor layer 58 when bent), a protective layer 472 may be included. Protective layer 472 overlaps the edge of thin-film transistor layer 58. The protective layer may be formed from a portion of a solder resist layer (e.g., a solder mask layer) or any other desired dielectric material. Protective layer 472 may directly contact the edge of thin-film transistor layer 58 when flexible printed circuit 64 is bent.

Figure 41:
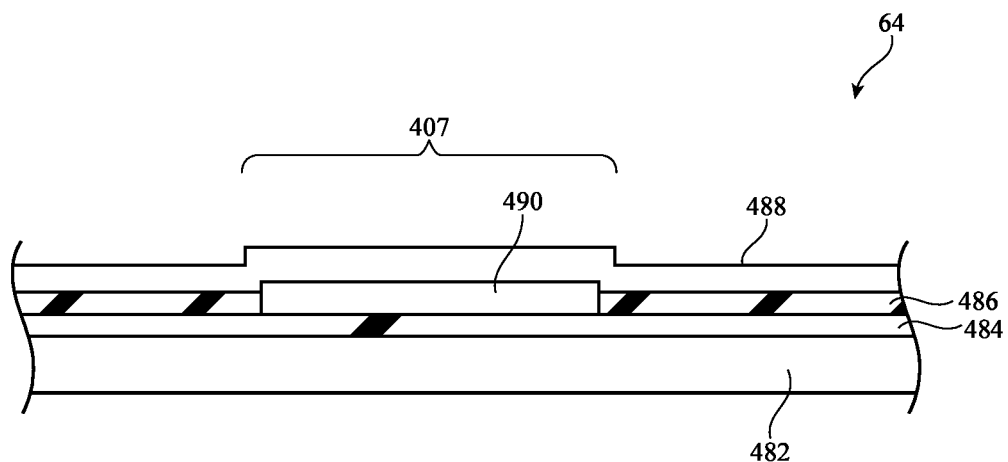
FIG. 41 is a cross-sectional side view of an illustrative flexible printed circuit in which a tin layer has been omitted in a bending region in accordance with an embodiment.

The traces of flexible printed circuit 64 may include both copper and tin. However, areas of the flexible printed circuit with tin may be more brittle and may crack if bent (due to metallic bonding stresses). Therefore, tin may be omitted from the flexible printed circuit in the bent region of the flexible printed circuit board. FIG. 41 is a cross-sectional side view of an illustrative flexible printed circuit board. As shown, the flexible printed circuit board may include a base layer 482 (sometimes referred to as substrate layer 482 or polyimide layer 482). The base layer 482 may be formed from any desired dielectric material (e.g., polyimide). A copper trace 484 may be formed over the base layer and a tin trace may be formed over the copper trace. To prevent the tin trace from being present in bending region 407, a solder resist 490 (sometimes referred to as masking layer 490, solder mask 490, etc.) may be included in bending region 407. An additional solder resist 488 may be included over the tin layer 486 (in the non-bending regions) and over the solder resist 490 (in bending region 407).

The arrangement of FIG. 41 may ensure that no tin is present in bending region 407. However, the presence of two solder resist layers (e.g., solder resist 488 and solder resist 490) may result in a higher stiffness than desired in bending region 407. To ensure that no tin is present in bending region 407 and reduce stiffness in the bending region, an arrangement of the type shown in FIG. 42 may be used.

Figure 42:
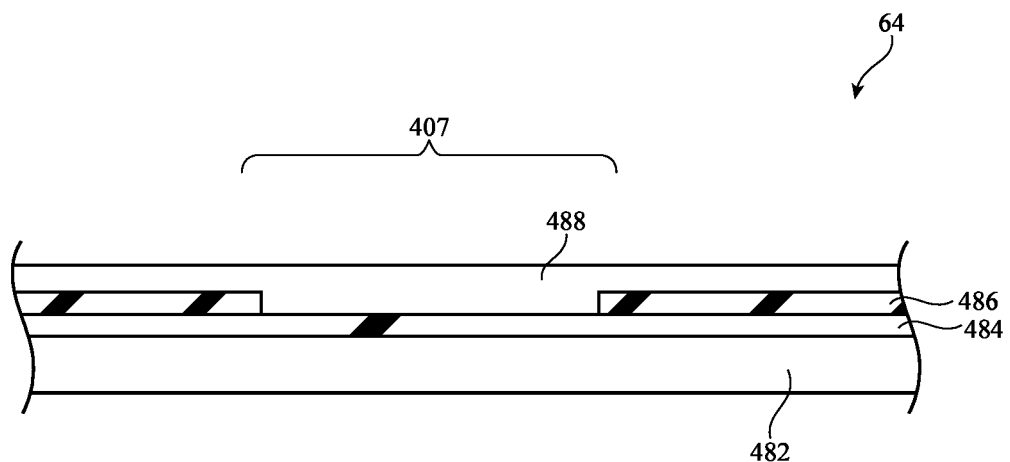
FIG. 42 is a cross-sectional side view of an illustrative flexible printed circuit in which a tin layer has been omitted in a bending region and only one solder resist is included in the bending region in accordance with an embodiment.

As shown in FIG. 42, a removable masking layer may be used to omit tin in bending region 407. Solder resist 488 may then fill the gap between tin 486 and cover tin 486 in regions where the tin is present. In other words, solder resist 488 may directly contact both the upper surface of copper trace 484 (e.g., in bending region 407) and tin trace 486 (e.g., outside of bending region 407). Removing the first masking layer used to omit tin in bending region 407 reduces the thickness of the flexible printed circuit board in bending region 407. The reduced thickness in bending region 407 reduces stiffness compared to FIG. 41.

Display 14 may be characterized by color performance statistics such as white point. The white point of a given display is commonly defined by a set of chromaticity values that represent the color produced by the display when the display is generating all available display colors at full power. Prior to any corrections during calibration, the white point of the display may be referred to as the "native white point" of that display. For example, the native white point may be associated with operating all of the red, green, and blue subpixels in the display at RGB levels of 255 (on a scale from 0-255).

Due to manufacturing differences between displays, the native white point of a display may differ, prior to calibration of the display, from the desired (target) white point of the display. The target white point may be defined by a set of chromaticity values associated with a reference white (e.g., a white produced by a standard display, a white associated with a standard illuminant such as the D65 illuminant of the International Commission on Illumination (CIE), a white produced at the center of a display). In general, any suitable white point may be used as a target white point for the display.

In some cases, pixel values may be reduced (truncated) in order to correct the white point of displayed light. For example, during display calibration, RGB values may be determined that correspond to various reference white points (e.g., a first set of RGB values may be identified that correspond to the D65 illuminant of the International Commission on Illumination (CIE), a second set of RGB values may be identified that correspond to the D110 illuminant of the CIE, etc.). FIGS. 43A and 43B shows illustrative tables of RGB values associated with different white points. FIG. 43A shows RGB values (sometimes referred to as gray levels) of 255 for red, 255 for green, and 255 for blue (e.g., (255, 255, 255)). This may correspond to the native white point of the display. FIG. 43B, meanwhile, shows RGB values resulting in a white point that matches the D65 illuminant of the International Commission on Illumination (CIE). As shown in FIG. 43B, to produce the desired white point, red has a gray level of 241, green has a gray level of 254, and blue has a gray level of 234. In other words, the native white point of the display may, in this example, be more blue than the target D65 illuminant. Therefore, the blue value is reduced (truncated) to match the D65 illuminant.

Truncating the gray levels of some of the subpixels allows for the display to match a desired white point but may present other challenges. In particular, the length of time to update each subpixel between frames may vary. For example, consider a scenario in which a user is scrolling through content on the display. In this use-case, the displayed content moves rapidly across the display. In one common scenario, the display may present content with a white background and black text. As the user scrolls, the black text moves across the white background. In these types of scenarios, the pixels may frequently transition from white to black.

As shown in FIGS. 43A and 43B, the truncated pixel values used to provide the desired white point may result in differences in the white-to-black transitions of the different colored subpixels. White-to-black transition time may refer to the length of time it takes for the pixel to transition from its white point gray level to within 10% its black gray level (e.g., 0). As depicted in FIG. 43A, when the display has gray level values of 255 for red, green, and blue subpixels, the white-to-black transition time of each pixel-type may be the same (e.g., the red pixel transition time is 10.0 seconds, the green pixel transition time is 10.0 seconds, and the blue pixel transition time is 10.0 seconds). It should be understood that these times are merely illustrative. There may be some variance (e.g., ±0.1 milliseconds, ±0.2 milliseconds, ±0.3 milliseconds, etc.) between the transition times even when a gray level of 255 is used for each color pixel. However, because each pixel is changing from a gray level of 255 to a gray level of 0, the transition times are generally similar.

As shown in FIG. 43B, when the truncated subpixel values are used (for a corrected white point), the white-to-black transitions of the different colored subpixels may vary. In FIG. 43B, the red subpixel transition time (e.g., from 241 to 0) is 9.5 seconds, the green subpixel transition time (e.g., from 254 to 0) is 10.0 seconds, and the blue subpixel transition time (e.g., from 234 to 0) is 9.4 seconds. As a result of these differences in transition time, the display may have a greenish hue during white-to-black transitions (because the green brightness level falls more slowly than the red and blue brightness levels).

Figure 44:
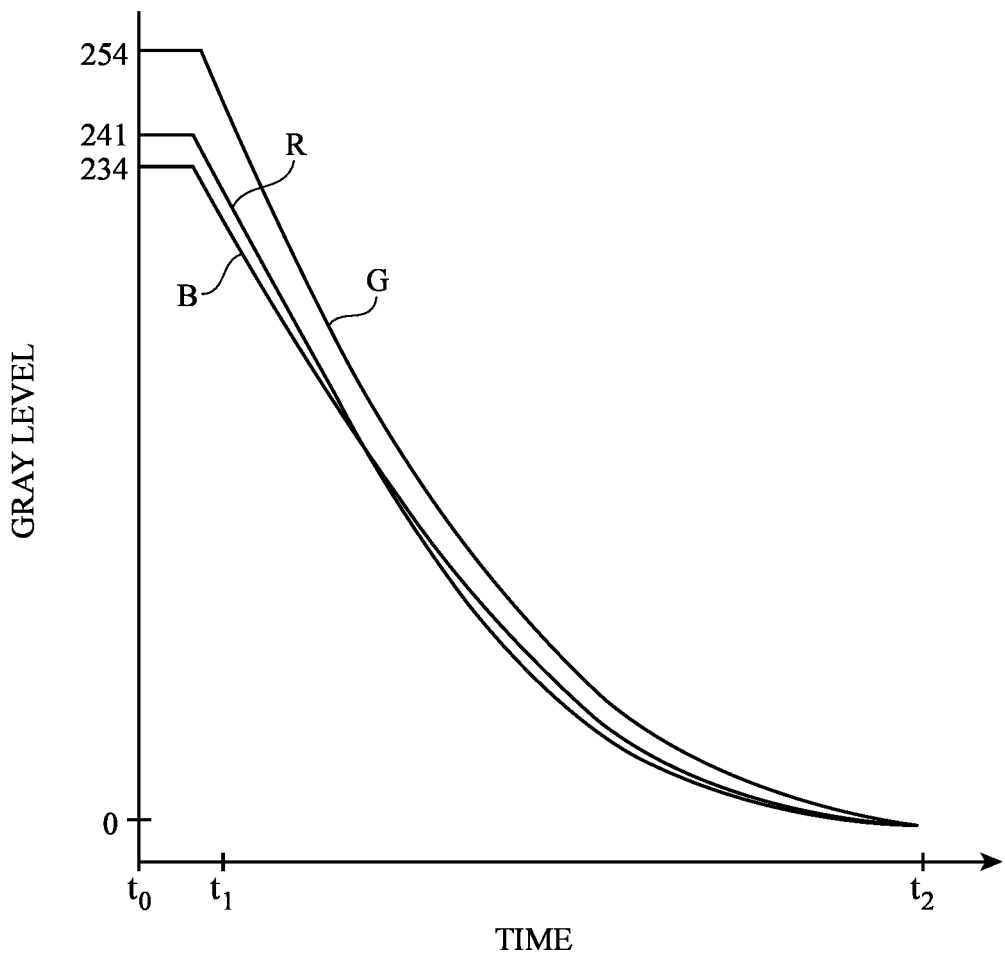
FIG. 44 is a graph showing how red, blue, and green sub-pixel brightness levels may vary during white-to-black transitions in accordance with an embodiment.

FIG. 44 is a graph showing how the green brightness level may fall slowly during white-to-black transitions, resulting in a greenish hue on the display during white-to-black transitions. A gray level response curve G is depicted for a green subpixel, a gray level response curve R is depicted for a red subpixel, and gray level response curve B is depicted for a blue subpixel. As shown, at $t_0$ the pixel may have RGB values corresponding to the white point of FIG. 43B for matching the D65 illuminant. In other words, at $t_0$, the red subpixel has a value of 241, the green subpixel has a value of 254, and the blue subpixel has a value of 234. At $t_1$, the pixel may begin to transition to black. Ultimately, at $t_2$, the red, blue, and green subpixels will all have a gray level of 0. However, as shown in FIG. 44, the green pixel has a higher starting point and therefore has a response curve that is generally higher than the response curves of the red and blue pixels. The shapes of the response curves shown in FIG. 44 are merely illustrative. In general, each of the response curves may have any desired shape. However, the green response curve may be higher than the blue and red response curves at one or more points during the transition, contributing to the apparent green hue during white-to-black transitions.

Figure 45:
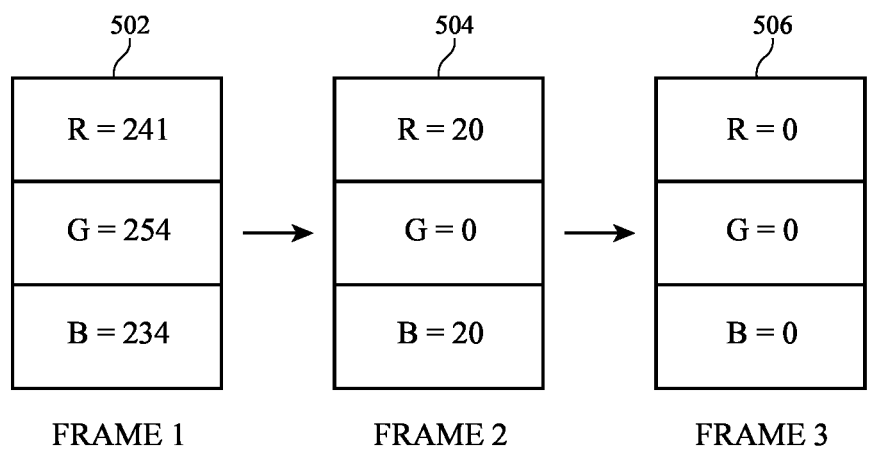
FIG. 45 shows how pixels may be provided with intermediate target values during transitions to mitigate visible artifacts during the transitions in accordance with an embodiment.

FIG. 45 illustrates how pixels may be provided with intermediate target values to suppress color motion blur (e.g., an undesirable green appearance during a white-to-black transition). Initially, a pixel in image frame F1 may have red, green, and blue subpixel values 502 of (241, 254, 234) corresponding to the white point of FIG. 43B. Then, the pixels may need to transition from white to black (e.g., during scrolling of a black text on a white background). Therefore, the final target values for the red, green, and blue subpixels are (0, 0, 0). This target pixel state 506 will be reached when display 14 displays frame F3.

However, to suppress the aforementioned green shadow, an intermediate set of target values is temporarily imposed on the pixels. The temporary target values for these pixel include increased (overdriven) red and blue subpixel values. In the example of FIG. 45, intermediate frame F2 has been provided with temporary target values 504 for the red, green, and blue subpixels of (20, 0, 20)—i.e., the red subpixel value has been temporarily increased and the blue subpixel value has been temporarily increased. Temporarily increasing the red and blue subpixel values slows down the red and blue transition times to more closely match the green transition time. This therefore mitigates the undesired green appearance during white-to-black transitions.

The values provided in FIG. 45 are merely illustrative. In general, any desired intermediate values may be used to mitigate artifacts associated with white-to-black transitions or other transitions in the display. When a pixel transitions from white to black, the red and blue subpixels may be temporarily overdriven (e.g., operated at a gray level that is higher than the ultimate target gray level) while the green subpixels may not be overdriven or may be overdriven to a lesser degree than the red and blue subpixels (e.g., operated at a gray level that is at or close to the ultimate target gray level).

Figure 46:
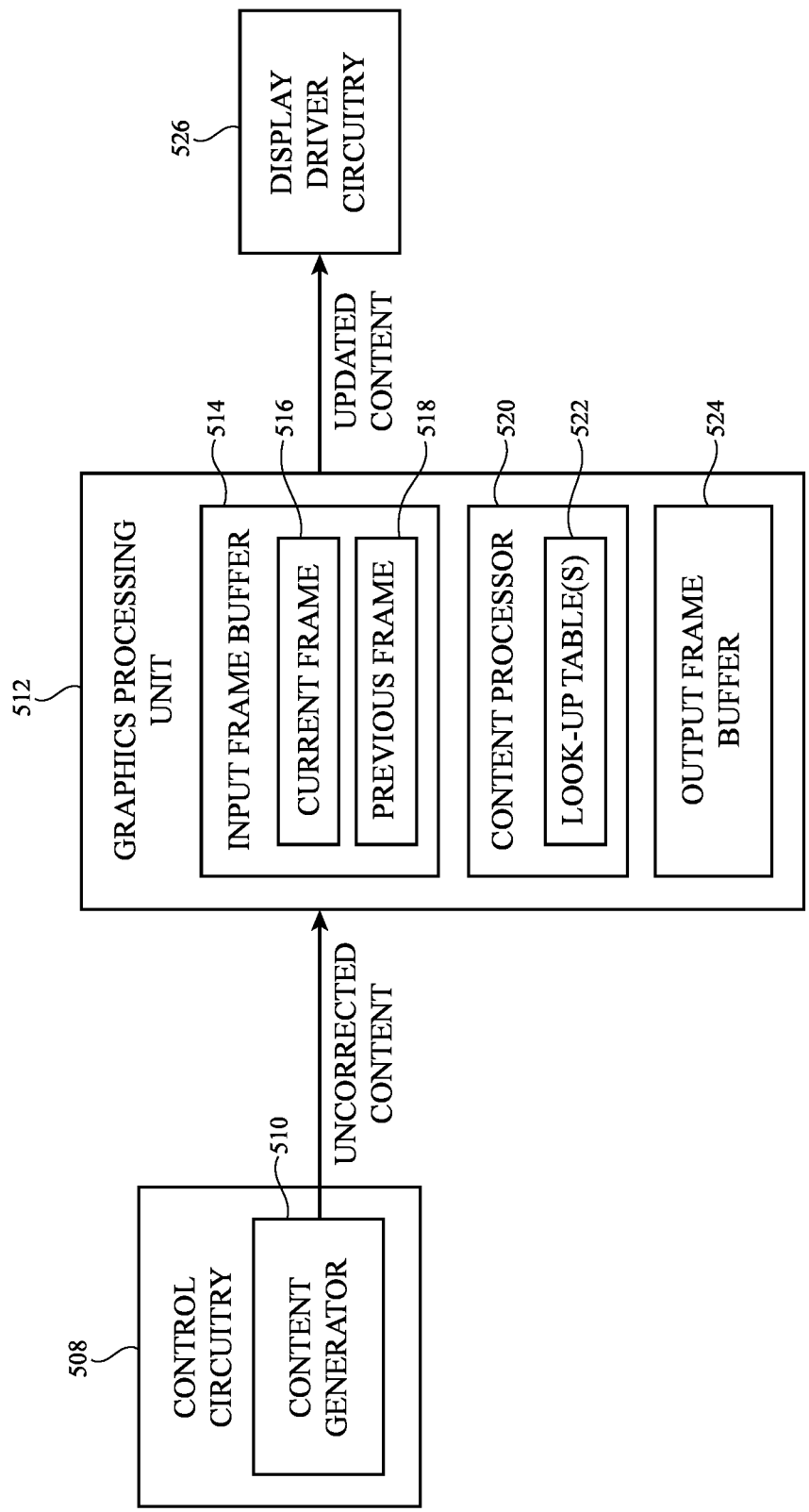
FIG. 46 is a diagram of illustrative resources that may be used in an electronic device to reduce color-artifacts such as a green appearance during white-to-black transitions in accordance with an embodiment.

A diagram of illustrative resources that may be used in device 10 to reduce color-artifacts such as the aforementioned green appearance during white-to-black transitions is shown in FIG. 46. As shown in FIG. 46, device 10 may include control circuitry such as control circuitry 508. Control may be part of control circuitry 16 in FIG. 1 if desired. Control circuitry 508 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 508 may be used to control the operation of device 10. This processing circuitry may be based on one or more microprocessors, microcontrollers, digital signal processors, application specific integrated circuits, etc.

Control circuitry 508 may be used to run software on device 10, such as operating system software, application software, firmware, etc. As shown in FIG. 46, the software running on control circuitry 508 may include code that generates content that is to be presented on display 14 (see, e.g., content generator 510, which may be an operating system function, an e-book reader or other software application, or other code that is running on control circuitry 508). Content generator 510 may generate content that has not been corrected to reduce color-based transition artifacts (uncorrected content) and this content may be supplied to graphics processing unit 512.

Graphics processing unit 512 may include an input frame buffer such as buffer 514 or other storage to maintain information on a current image frame 516 and one or more earlier frames such as previous image frame 518. Graphics processing unit 512 may also include an output frame buffer such as output frame buffer 524 that stores content in which one or more pixels may have been modified to reduce transition artifacts such as a green hue on white-to-black transitions. Content processor 520 may use one or more look-up tables 522 to process uncorrected content and produce corresponding updated content in which pixels have been modified to mitigate transition based artifacts.

Look-up tables may have associated overdrive gray levels associated with a starting gray level and an ending gray level. For example, in the example provided in FIG. 45, a blue subpixel transitions from an initial value of 234 to a target value of 0. The look-up table may have an entry associated with this scenario for a corresponding modified value of 20, as is reflected in FIG. 45. Any desired number of look-up tables may be used to generated the modified image data that is provided to output frame buffer 524.

The updated content with decreased transition artifacts may be supplied to display driver circuitry 526 of display 14. Display driver circuitry 526 may include integrated circuit(s) and/or thin-film transistor circuitry on display 14 for displaying the content that is received on the pixels of the display.

Figure 47:
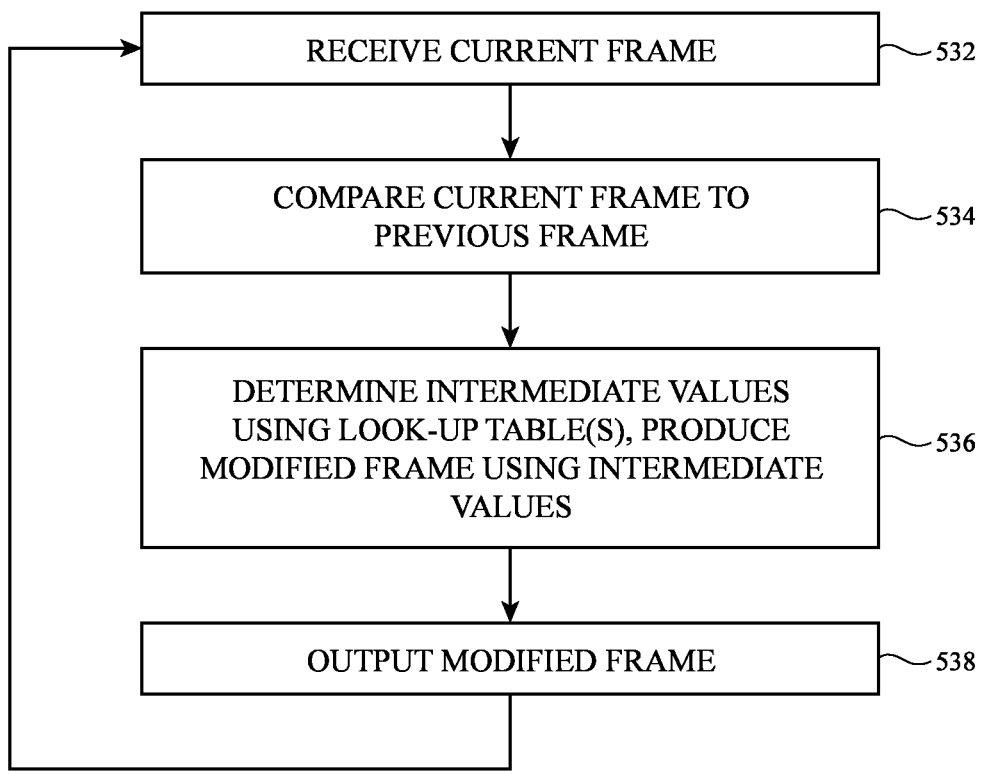
FIG. 47 is a flowchart of illustrative operations involved in using resources of the type shown in FIG. 46 in displaying content with reduced artifacts in accordance with an embodiment.

Illustrative operations involved in using resources of the type shown in FIG. 46 in displaying content with reduced artifacts are shown in FIG. 47. Initially, content generator 510 may generate content to be displayed on display 14 and graphics processing unit 512 may receive the content. The content may include frames of image data. Content processor 520, which may be implemented using software and/or hardware resources associated with graphics processing unit 512, may receive a frame of image data (sometimes referred to as an image frame or content frame) from content generator 510 at step 532.

During the operations of step 534, content processor 520 may use frame buffer 514 to store frames of image data including current frame 516 and previous frame 518. Content processor 520 may compare the pixel values in current frame 516 and previous frame 518 to identify gray level transitions that may be susceptible to artifacts (e.g., an undesired green hue). After each current frame is processed, processor 520 may store the data of the current frame as previous frame 518.

At step 536, content processor 520 may use one or more look-up tables 522 to determine intermediate values for one or more pixels. The intermediate values may be used to mitigate artifacts associated with white-to-black transitions, for example. Frames of data that have been processed by content processor 520 may be stored in output frame buffer 524. The modified frame (i.e., a frame such as frame F2 of FIG. 45) can be output at step 538 and subsequently displayed by display driver circuitry 526. As indicated by line 540, processing can then loop back to step 532 so that additional content from content generator 510 can be processed.

If desired, the image processing operations involved in implementing the transition artifact mitigation process of processor 520 may be implemented in full or in part in control circuitry 508 (e.g., as part of an operating system or application or both an operating system and application), may be implemented in full or in part in display 14 (e.g., using resources in a timing controller integrated circuit or other circuitry in display drier circuitry 526), may be implemented in full or in part on graphics processing unit 512 as described in connection with FIG. 46, and/or may be implemented using other resources in device 10 or any combination of two or three or more of these sets of resources. The use of a scenario in which blur abatement image processor 520 is implemented on graphics processing unit 512 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
   display layers that include a thin-film transistor layer;
   a printed circuit board that includes a first contact;
   a flexible printed circuit coupled between the thin-film transistor layer and the printed circuit board, wherein the flexible printed circuit has a second contact that is coupled to the first contact on the printed circuit board and wherein the first and second contacts have first and second opposing sides;
   a display driver integrated circuit mounted on the flexible printed circuit;
   a first encapsulant layer formed on the first side of the first and second contacts; and
   a second encapsulant layer formed on the second side of the first and second contacts, wherein the second encapsulant layer directly contacts an upper surface of the flexible printed circuit, an edge of the flexible printed circuit, and an upper surface of the printed circuit board; and
   wherein the first encapsulant layer is attached to a lower surface of the flexible printed circuit and an edge of the printed circuit board.

2. The electronic device defined in claim 1, wherein the second encapsulant layer conforms to the second side of the first and second contacts.

3. The electronic device defined in claim 1, wherein the second encapsulant layer directly contacts a lower surface of the flexible printed circuit.

* * * * *